US012790691B2

(12) United States Patent
Rezaei et al.

(10) Patent No.: US 12,790,691 B2
(45) Date of Patent: Nov. 10, 2026

(54) MOUNTING STRUCTURES FOR FLOW SUBSTRATES

(71) Applicant: Compart Systems PTE. LTD., Singapore (SG)

(72) Inventors: Frederick Rezaei, Phoenix, AZ (US); Kim Ngoc Vu, Yorba Linda, CA (US)

(73) Assignee: Compart Systems PTE. LTD., Singapore (SG)

( * ) Notice: Subject to any disclaimer, the term of this patent is extended or adjusted under 35 U.S.C. 154(b) by 0 days.

(21) Appl. No.: 18/197,514

(22) Filed: May 15, 2023

(65) Prior Publication Data

US 2024/0052489 A1 Feb. 15, 2024

Related U.S. Application Data

(63) Continuation of application No. 16/514,667, filed on Jul. 17, 2019, now Pat. No. 11,685,997.

(60) Provisional application No. 62/804,086, filed on Feb. 11, 2019, provisional application No. 62/699,196, filed on Jul. 17, 2018.

(51) Int. Cl.

| | |
|---|---|
| ***C23C 16/455*** | (2006.01) |
| ***F16L 3/00*** | (2006.01) |
| ***F16L 41/02*** | (2006.01) |
| ***F16L 41/03*** | (2006.01) |
| ***H01J 37/32*** | (2006.01) |
| ***H10P 72/00*** | (2026.01) |

(52) U.S. Cl.

CPC .......... *C23C 16/45561* (2013.01); *F16L 3/00* (2013.01); *F16L 41/02* (2013.01); *F16L 41/03* (2013.01); *H01J 37/3244* (2013.01); *H10P 72/0402* (2026.01); *Y10T 137/87885* (2015.04)

(58) Field of Classification Search

CPC ...... C23C 16/45561; F16L 3/00; F16L 41/02; F16L 41/03; H01J 37/3244; H01L 21/67017; F16K 27/003

See application file for complete search history.

(56) References Cited

U.S. PATENT DOCUMENTS

| | | | | |
|---|---|---|---|---|
| 3,367,199 A * | 2/1968 | Dankowski | ............ | F16H 55/42 474/182 |
| 3,589,387 A | 6/1971 | Raymond | | |

(Continued)

FOREIGN PATENT DOCUMENTS

| | | |
|---|---|---|
| CN | 105555660 A | 5/2016 |
| DE | 1871880 U | 5/1963 |

(Continued)

*Primary Examiner* — Atif H Chaudry

(74) *Attorney, Agent, or Firm* — Dykema Gossett PLLC

(57) ABSTRACT

A flow substrate mounting structure comprising a fastener aperture and an alignment feature, wherein the alignment feature comprises at least one of an alignment pin removably coupled with the flow substrate mounting structure, an alignment slot, and an alignment step. A structure for coupling a plurality of flow substrates comprising a flow substrate mounting structure comprising a first fastener aperture, and a second fastener aperture, wherein the first fastener aperture is configured to couple with a first fastener and the second fastener aperture is configured to couple with a second fastener, wherein an alignment fixture is used to align the flow substrate mounting structure with the plurality of flow substrates.

17 Claims, 18 Drawing Sheets

(56) References Cited

U.S. PATENT DOCUMENTS

| | | | |
|---|---|---|---|
| 5,992,463 A | 11/1999 | Redemann et al. | |
| 6,394,138 B1 | 5/2002 | Vu et al. | |
| 8,307,854 B1 | 11/2012 | Vu | |
| 8,496,029 B2 | 7/2013 | Vu | |
| 11,685,997 B2 * | 6/2023 | Rezaei | F16K 27/003 137/343 |
| 2003/0116208 A1 | 6/2003 | Eriksson et al. | |
| 2005/0005981 A1 | 1/2005 | Eidsmore et al. | |
| 2006/0005891 A1 | 1/2006 | Doyle | |
| 2008/0041479 A1 | 2/2008 | Perusek et al. | |
| 2012/0001419 A1 * | 1/2012 | Wohlfarth | F16L 19/00 285/330 |
| 2014/0311589 A1 | 10/2014 | Eley et al. | |
| 2018/0082870 A1 * | 3/2018 | Wolgast | H01L 21/67017 |

FOREIGN PATENT DOCUMENTS

| | | | |
|---|---|---|---|
| EP | 1718901 | A1 | 11/2006 |
| JP | H1047516 | A | 2/1998 |
| JP | H1069317 | A | 3/1998 |
| JP | 2008008446 | A | 1/2008 |
| JP | 2016048110 | A | 4/2016 |
| KR | 20100021471 | A | 2/2010 |
| WO | 2018047907 | A1 | 6/2019 |

* cited by examiner

FIG. 3D
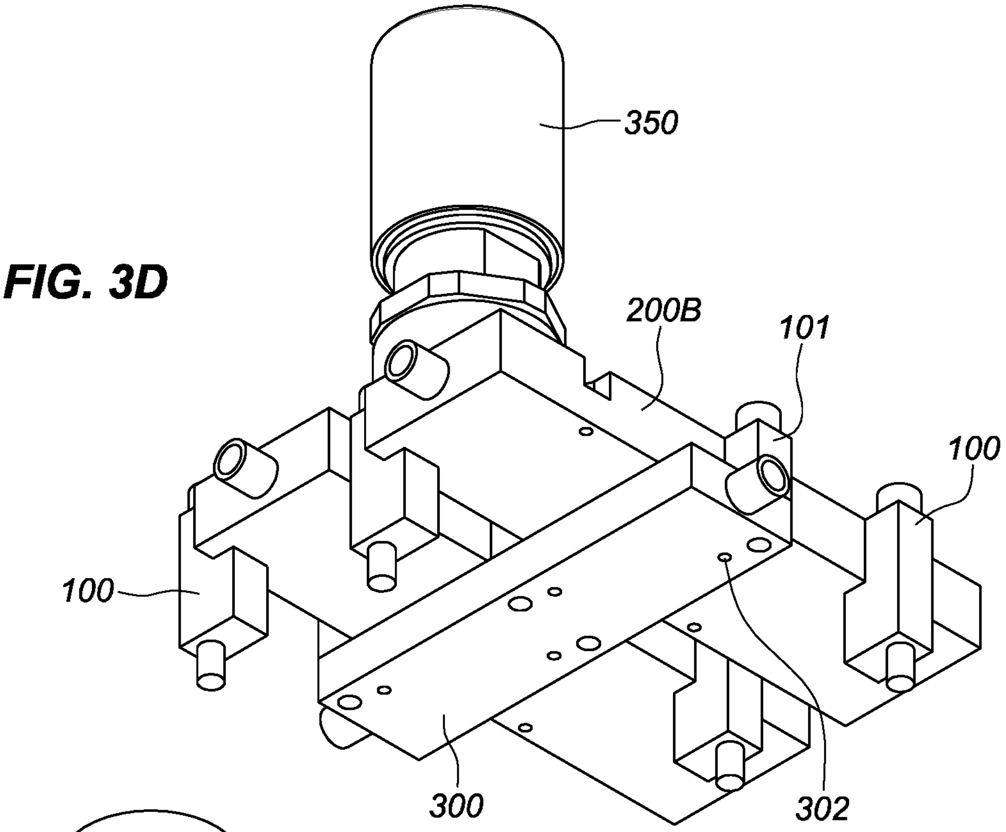
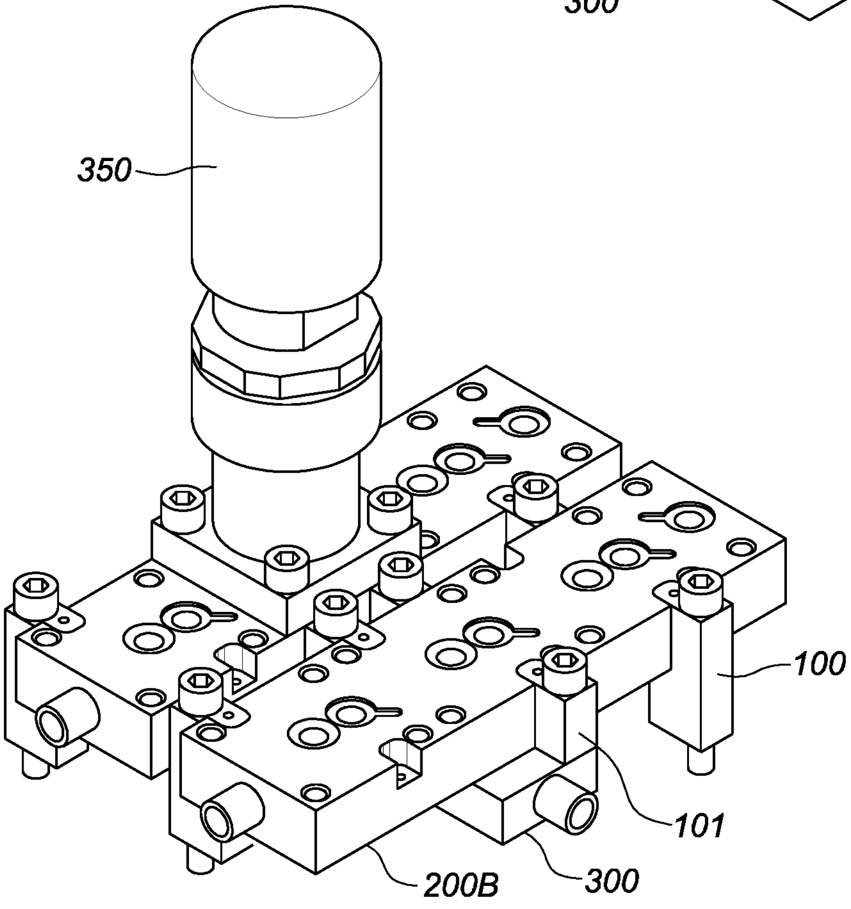
FIG. 3E

MOUNTING STRUCTURES FOR FLOW SUBSTRATES

CROSS-REFERENCE TO RELATED APPLICATIONS

This application is a continuation of U.S. application Ser. No. 16/514,667, filed 17 Jul. 2019 (the '667 application), which claims priority under 35 U.S.C. § 119(e) to U.S. provisional patent application No. 62/699,196, filed on Jul. 17, 2018 (the '196 application), and U.S. provisional patent application No. 62/804,086, filed on Feb. 11, 2019 (the '086 application). The '667 application, the '196 application, and the '086 application are all hereby incorporated by reference in their entirety as though fully set forth herein.

FIELD OF THE DISCLOSURE

The present disclosure is directed to mounting structures for fluid delivery systems, and more particularly to extreme flow rate and/or high temperature surface mount fluid delivery systems for use in the semiconductor processing and petrochemical industries.

BACKGROUND

Fluid delivery systems are used in many modern industrial processes for conditioning and manipulating fluid flows to provide controlled admittance of desired substances into the processes. Practitioners have developed an entire class of fluid delivery systems which have fluid handling components removably attached to flow substrates containing fluid pathway conduits. Many fluid delivery systems utilize some intermediate structure to mount the flow substrates, manifolds, or fluid delivery sticks to a support surface. In most cases, these structures are specific to a particular fluid delivery system design, and cannot be used with alternative designs.

The arrangement of such flow substrates establishes the flow sequence by which the fluid handling components provide the desired fluid conditioning and control. The interface between such flow substrates and removable fluid handling components is standardized and of few variations. Such fluid delivery system designs are often described as modular or surface mount systems. Representative applications of surface mount fluid delivery systems include gas panels used in semiconductor manufacturing equipment and sampling systems used in petrochemical refining. The many types of manufacturing equipment used to perform process steps making semiconductors are collectively referred to as tools. Embodiments of the present disclosure relate generally to fluid delivery systems, such as fluid delivery systems for semiconductor processing, and specifically to surface mount fluid delivery systems that are suited for use in extreme flow rate and/or high temperature applications where the process fluid is to be heated to a temperature above ambient. Aspects of the present disclosure are applicable to structures for mounting surface mount fluid delivery systems to a support structure or manifold, whether of a localized nature or distributed around a semiconductor processing tool.

U.S. Pat. No. 8,496,029 B2 issued on Jul. 30, 2013, which is incorporated herein by reference, describes a fluid delivery system in which the flow substrates can include fluid pathways that route the fluid in a longitudinal direction from the inlet of the flow substrate to the outlet of the flow substrate as well as in a transverse direction. As described therein, the fluid pathways may be formed in a surface of the substrate opposing the surface to which fluid handling components are attached and then sealed with a cap.

A collection of fluid handling components assembled into a sequence intended for handling a single fluid species is frequently referred to as a fluid delivery stick. The equipment subsystem comprised of several fluid delivery sticks intended to deliver process fluid to a particular semiconductor processing chamber is often called a gas panel. During the 1990*s* several inventors attacked problems of gas panel maintainability and size by creating fluid delivery sticks wherein the general fluid flow path is comprised of passive metallic structures, containing the conduits through which process fluid moves, with valves and like active (and passive) fluid handling components removably attached thereto. The passive fluid flow path elements have been variously called manifolds, substrates, blocks, and the like. This disclosure chooses to use the terminology flow substrate to indicate fluid delivery system elements which contain passive fluid flow path(s) that may have other fluid handling devices mounted there upon.

The flow substrates may form a portion of a fluid delivery stick, an entire fluid delivery stick, or even an entire fluid delivery panel that would, in conventional designs, include a number of individual fluid delivery sticks. As in the fluid delivery system described in U.S. Pat. No. 8,307,854 B1 in which individual fluid delivery stick brackets are mounted to a support surface, the fluid flow substrates described in U.S. Pat. No. 8,496,029 B2 are also mounted to a support surface.

Applicant appreciates that nearly all fluid delivery systems utilize some intermediate structure to mount the fluid flow substrates, manifolds, or fluid delivery sticks to a support surface. In most cases, these structures are specific to a particular fluid delivery system design, and cannot be used with alternative designs.

BRIEF DESCRIPTION OF THE DRAWINGS

FIGS. 3A-3E illustrate various plan, perspective and end views of a portion of a fluid delivery system, consistent with embodiments of the present disclosure.

FIG. 9B1 illustrates a perspective view of the mounting structure of FIG. 9A, consistent with embodiments of the present disclosure.

FIG. 9B2 illustrates a perspective view of the mounting structure of FIGS. 9A-B1 with an alignment fixture, consistent with embodiments of the present disclosure.

DETAILED DESCRIPTION OF EMBODIMENTS

Figure 1A:
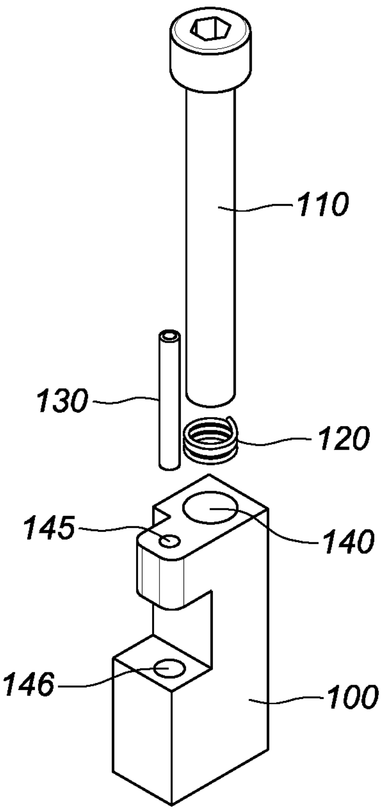
FIGS. 1A-D illustrate mounting structures, consistent with embodiments of the present disclosure.

The present disclosure is directed to fluid delivery systems, and more particularly, to structures for mounting fluid delivery system components such as flow substrates and manifolds to a support surface. Several embodiments of modular flow substrates, mounting structures, and systems including combinations thereof are disclosed herein. Details of the various embodiments of the present disclosure are described below with specific reference to the figures. The modular flow substrates, mounting structures, and systems disclosed herein are not limited to the specific examples set forth in the following description or illustrated in the drawings. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

It should be appreciated that the fluid materials manipulated in the fluid delivery flow substrates of the present embodiments may be a gaseous, liquid, or vaporous substance that may change between liquid and gas phase dependent upon the specific temperature and pressure of the substance. Representative fluid substances may be a pure element such as argon (Ar), a vaporous compound such as boron trichloride ($BCl_3$), a mixture of normally liquid silicon tetrachloride ($SiCl_4$) in carrier gas, or an aqueous reagent.

U.S. Pat. No. 8,307,854 B1 issued on Nov. 13, 2012, which is incorporated herein by reference, describes a surface mount fluid delivery system in which individual fluid flow substrates with fluid handling components mounted thereon may be mounted to a standardized bracket to form a fluid delivery stick in which fluid pathways within the flow substrate route the fluid in a longitudinal direction from the inlet to the outlet of the fluid delivery stick. As described therein, manifolds forming a second layer below the plane of the flow substrates and mountable to the flow substrates from above the flow substrates may be used to route the fluid in a transverse direction between adjacent fluid delivery sticks, as well as along a respective fluid delivery stick. Advantageously, the fluid flow substrates, manifolds, and the fluid delivery stick bracket may be manufactured in a cost-effective manner and individual fluid delivery sticks may be removed and replaced as an integral unit simply by removing fasteners associated with one or more of the manifolds and any fasteners associated with mounting the fluid delivery stick bracket to the support surface.

U.S. Pat. No. 8,496,029 B2 issued on Jul. 30, 2013, which is incorporated herein by reference, describes an alternative surface mount fluid delivery system in which the fluid flow substrates can include fluid pathways that route the fluid in a longitudinal direction from the inlet of the flow substrate to the outlet of the flow substrate as well as in a transverse direction. As described therein, the fluid pathways may be formed in a surface of the substrate opposing the surface to which fluid handling components are attached and then sealed with a cap. These flow substrates may form a portion of a fluid delivery stick, an entire fluid delivery stick, or even an entire fluid delivery panel that would, in conventional designs, include a number of individual fluid delivery sticks. As in the fluid delivery system described in U.S. Pat. No. 8,307,854 B1 in which individual fluid delivery stick brackets are mounted to support surface, the fluid flow substrates described in U.S. Pat. No. 8,496,029 B2 are also mounted to a support surface.

Applicant has appreciated that nearly all fluid delivery systems utilize some intermediate structure to mount the fluid flow substrates, manifolds, or fluid delivery sticks to a support surface. In most cases, these structures are specific to a particular fluid delivery system design, and cannot be used with alternative designs. In light of this appreciation, embodiments described herein are directed to a mounting structure that may be used to mount a wide variety of fluid flow substrates, and combinations of fluid flow substrates and manifolds to a support surface. In accordance with an aspect of the embodiments described herein, the mounting structure can be used with conventional fluid substrate designs, such as described in U.S. Pat. No. 6,394,138, which is incorporated by reference herein, and known in the semiconductor processing industry as "K1S," as well as with more current designs, such as those described in U.S. Pat. No. 8,307,854 B1 and U.S. Pat. No. 8,496,029 B2 and in FIGS. 1-14 herein. As described further in detail herein, embodiments described herein can elevate the substrates and the combinations of substrates and manifolds above the surface to which they are mounted to permit the circulation of air around as well as below the fluid substrates and manifolds. The mounting structure uses a minimal amount of material, is compact, and can be used to mount either substrates, or combinations of substrates and manifolds to a support surface using interchangeable components.

The accompanying drawings are not intended to be drawn to scale. In the drawings, each identical or nearly identical component that is illustrated in various figures is represented by a like numeral. For purposes of clarity, not every component may be labeled in every drawing.

Figure 1B:
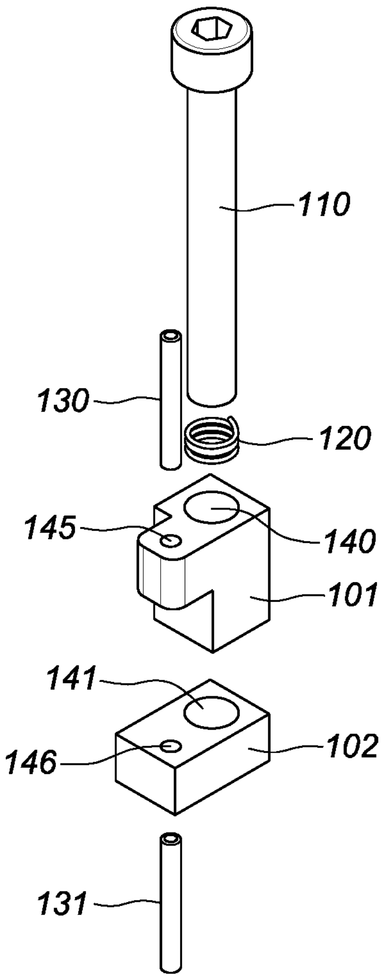
Figure 1C:
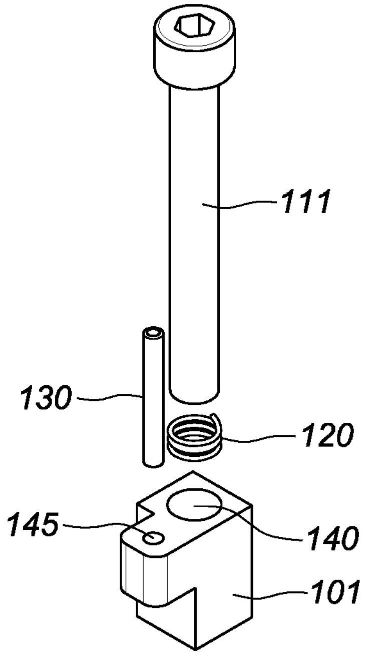
Figure 1D:
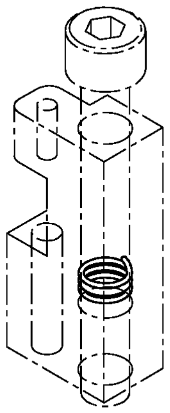

FIGS. 1A-D illustrate mounting structures in accordance with embodiments of the present disclosure in which FIG. 1A illustrates a mounting structure that includes a unitary mount body that may be used to mount a substrate to a support surface, FIG. 1B illustrates a multi-part mount body that may be used to mount a substrate and a manifold to a support surface, and FIG. 1C illustrates a portion of the multi-part mount body that may be used to mount a manifold to a substrate. The manner in which substrates, combinations of substrates and manifolds, and manifolds may be mounted to a support surface and to one another is shown in FIGS. 2-7.

As shown in FIG. 1A, in one embodiment of the present disclosure the mounting structure includes a unitary mount body 100 that may be used to mount a flow substrate, such as a K1S flow substrate as shown in FIGS. 1A and 1B of U.S. Pat. No. 8,307,854 B1, or a flow substrate such as those described in U.S. Pat. No. 8,496,029 B2 to a support surface. Although not specifically shown, the flow substrates shown in FIGS. 3-10 of U.S. Pat. No. 8,307,854 B1 may also be adapted to be used with the unitary mount body 100, as described further below. The unitary mount body 100 includes an aperture 140 that extends through the unitary mount body 100 and is adapted to receive a fastener 110 and a fastener retainer 120, such as a helical spring. Although not depicted in FIG. 1A, the fastener 110 is threaded at its distal end and would be received in an internally threaded aperture in the support surface (not shown). The fastener retainer 120 is received in the aperture 140 and acts to retain the fastener 110 in position. The unitary mount body 100 also includes apertures 145 and 146 that are adapted to receive a lock pin 130 that extends through an aperture 202 formed in a recess 201 (see FIG. 2A) of the body of the flow substrate 200B. As can be appreciated from FIG. 3, for example, access from only a single direction (e.g., from above) is all that is needed to mount the substrate, the fluid handling components, the manifolds, and the mount body to one another and to a support surface.

Figure 4A:
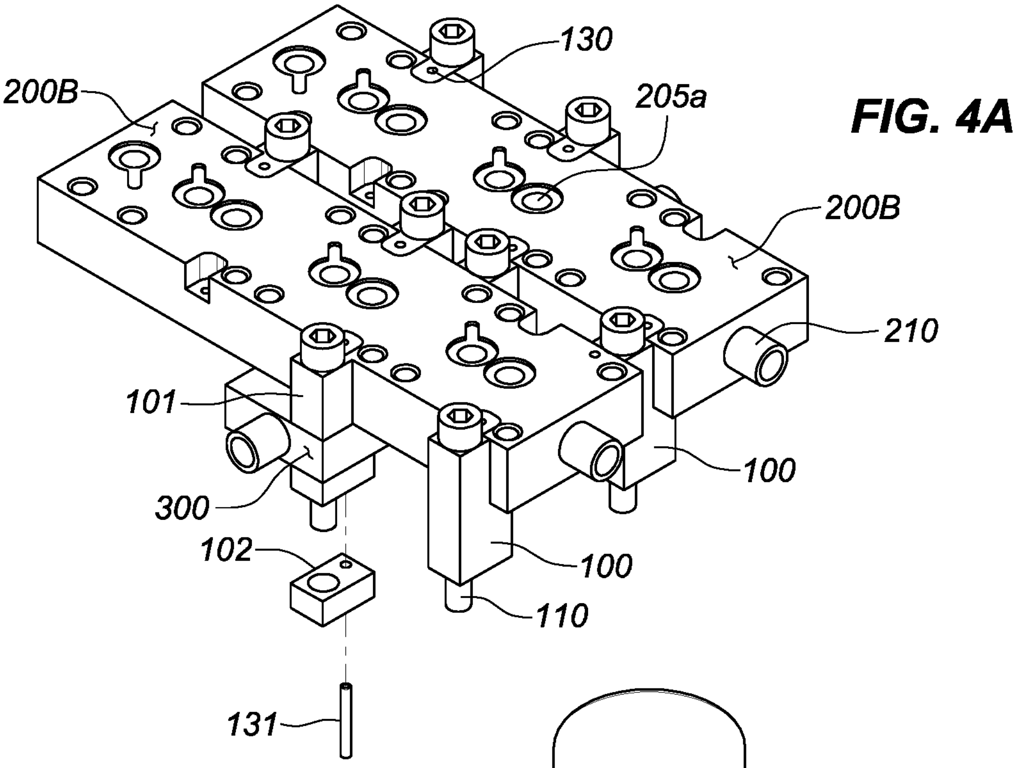
FIGS. 4A-B illustrates two different isometric views of the manner in which embodiments of the present disclosure may be used to mount a fluid flow substrate and the combination of a fluid flow substrate and a manifold to a support surface, consistent with embodiments of the present disclosure.
Figure 4B:
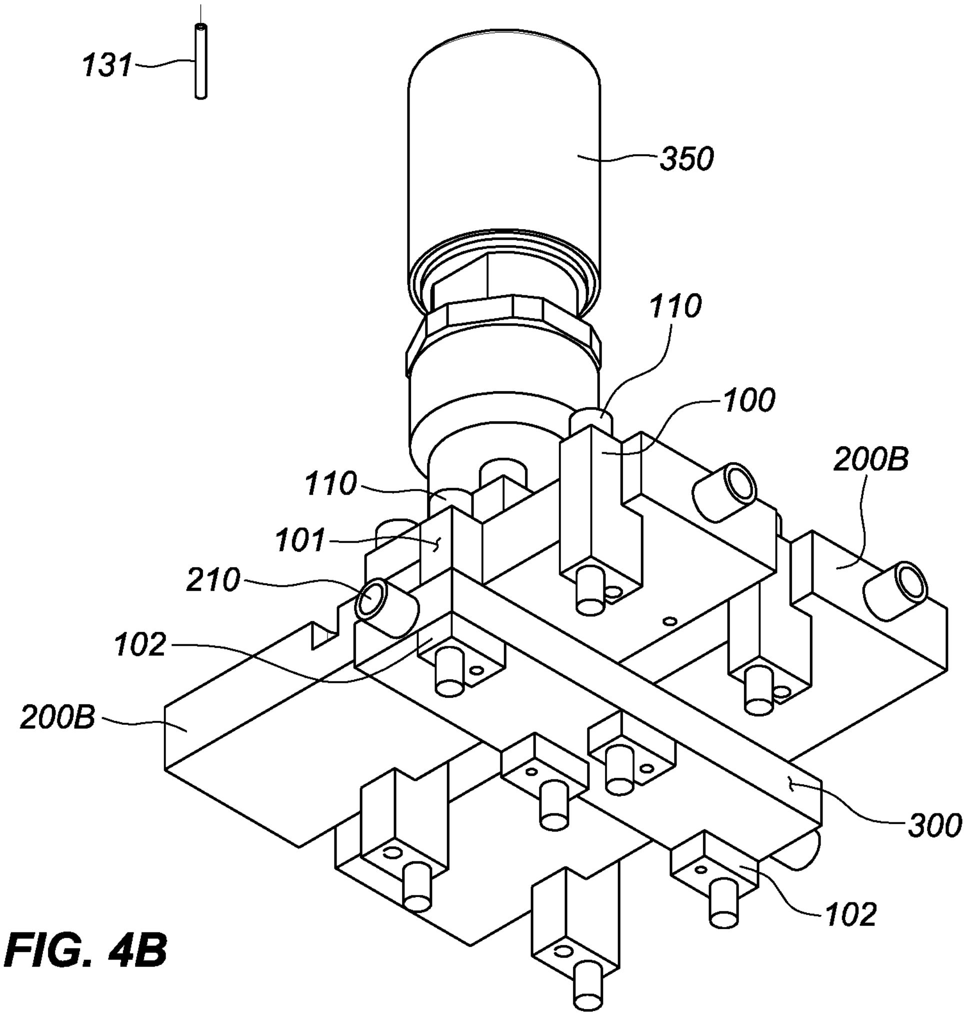
Figure 5:
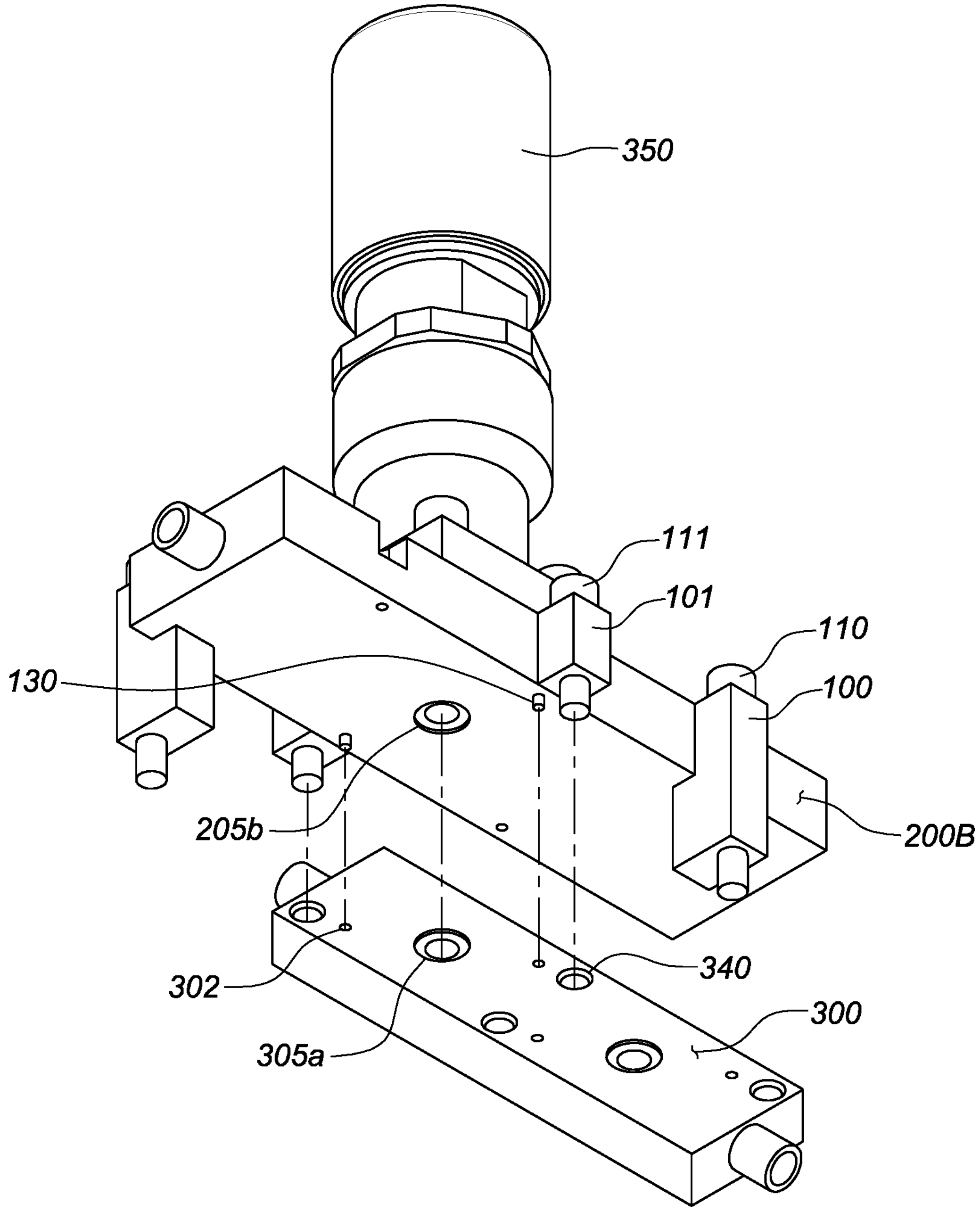
FIG. 5 illustrates the manner in which a fluid flow substrate and a manifold may be aligned and attached to one another, consistent with embodiments of the present disclosure.

Shown in FIG. 1B is a mounting structure that includes a multi-part mount body that includes a clamp 101 and a stand-off 102. As best shown in FIG. 4, the multi-part mount body is adapted to mount a fluid flow substrate, such as fluid flow substrate 200B, and a fluid manifold 300 to a support surface. The clamp 101 includes an aperture 140 that extends through the body of the clamp 140 and is adapted to receive the fastener 110 and the fastener retainer 120 in a manner similar to that described above with respect to FIG. 1A. The clamp 101 also includes an aperture 145 that is adapted to receive a lock pin 130 that extends through an aperture 202 formed in a recess 201 (see FIG. 2A) of the body of the flow substrate 200B and into an aperture 302 on an upper surface of the manifold 300 as shown in FIG. 5. The aperture 302 extends through the body of the manifold 300 as shown in FIG. 3D. The stand-off 102 also includes an aperture 141 that extends through the body of the stand-off 102 and is adapted to receive the fastener 110. The stand-off 102 further includes an aperture 146 that is adapted to receive a second lock pin 131 that is also received in the aperture 302 on a lower surface of the manifold 300. The lock pin 131 is used to retain the stand-off 102 on a lower surface of the manifold 300 during assembly. It should be appreciated that the multi-part mount body, when combined with the body of the manifold 300, forms a mounting structure that is structurally and dimensionally similar to unitary mount body 100, as illustrated in FIG. 3B. As can be appreciated from FIG. 3, for example, access from only a single direction (e.g., from above) is all that is needed to mount the flow substrate, the fluid handling components, the manifolds, and the mount body to one another and to a support surface.

FIG. 1C illustrates that a portion of the multi-part mount body, specifically, the clamp 101 may be used to mount a manifold, such as manifold 300 to the lower surface of a flow substrate, such as flow substrate 200B. The fastener 111 is similar to the fastener 110 described with respect to FIGS. 1A and 1B and although not depicted, is threaded at its distal end. However, the fastener 111 is shorter in length than fastener 110, and instead of being received in an internally threaded aperture of the support surface, it is received in an internally threaded aperture 340 in an upper surface of the manifold 300 (see FIG. 5). As the fastener 111 is tightened, it pulls the upper surface of the manifold 300 into registration with the lower surface of the flow substrate 200B and compresses a metal seal (not shown) that would be received in a counter bore surrounding a manifold port 305*a* formed in an upper surface of the manifold 300 to form a fluid tight seal with a corresponding manifold connection conduit port 205*b* formed in a lower surface of the flow substrate 200B.

Figure 2A:
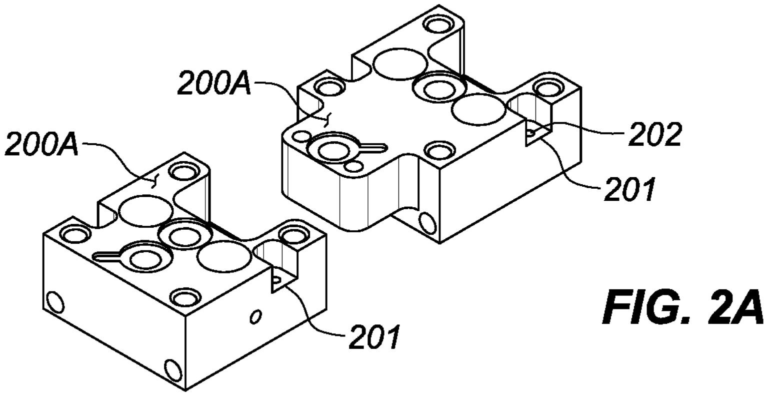
FIGS. 2A-C illustrates various fluid flow substrates, consistent with embodiments of the present disclosure.
Figure 2B:
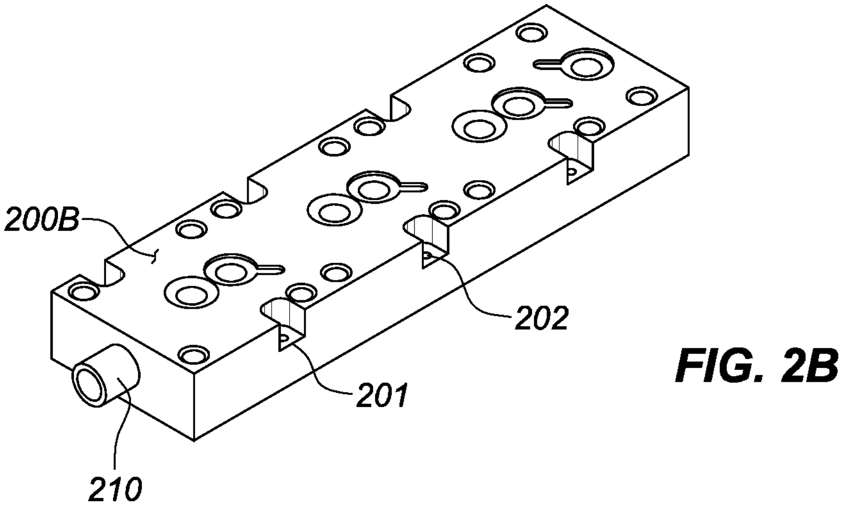
Figure 2C:
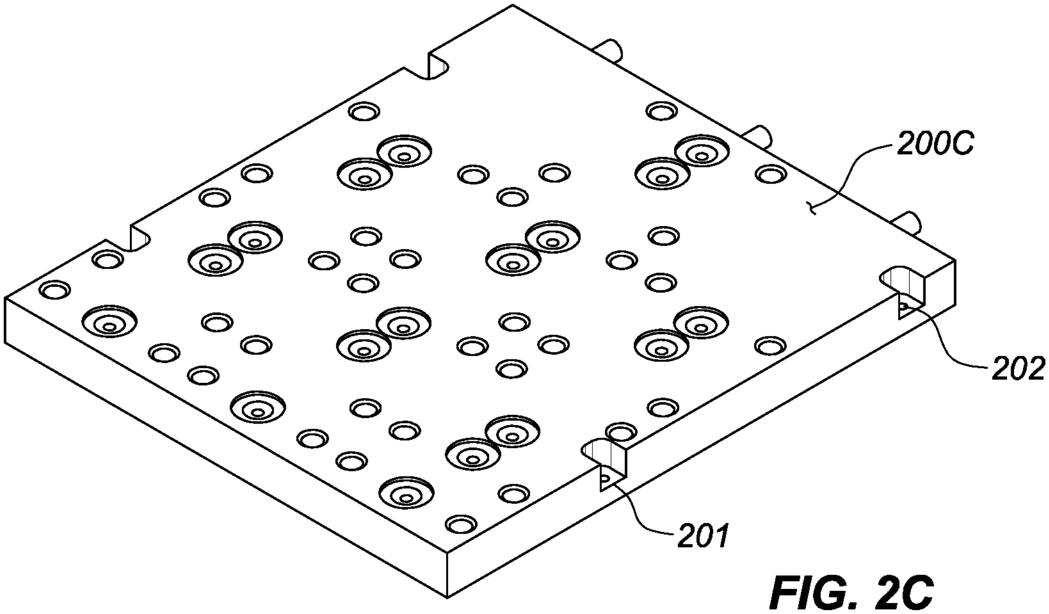

FIGS. 2A-C illustrates various fluid flow substrates 200 with which embodiments of the present disclosure may be used. For example, conventional fluid flow substrates such as K1S flow substrates 200A may be modified as shown in FIG. 2A to include a recess 201 in which a projecting portion of the unitary mount body 100 or clamp 101 is received. As shown, an aperture 202 is formed within the recess 201 to receive lock pin 130. Unitary fluid flow substrates such as those shown in FIGS. 2B and 2C may also be adapted for use with embodiments of the present disclosure. For example, FIG. 2B illustrates a unitary fluid flow substrate 200B that can be used to form a portion of a fluid delivery stick and which includes recesses 201 and apertures 202. FIG. 2C illustrates a unitary fluid flow substrate 200C such as that described in U.S. Pat. No. 8,496,029 B2 that can be used to form a portion of a fluid delivery panel, or even an entire fluid delivery panel, and which includes recesses 201 and apertures 202. It should be appreciated that although not depicted, the various substrates described in FIGS. 3-10 of U.S. Pat. No. 8,307,854 B1 can be modified to include a recesses 201 and apertures 202 in a similar manner.

Figure 3A:
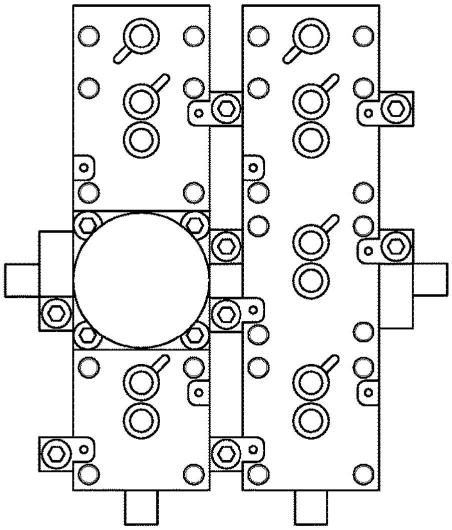
Figure 3B:
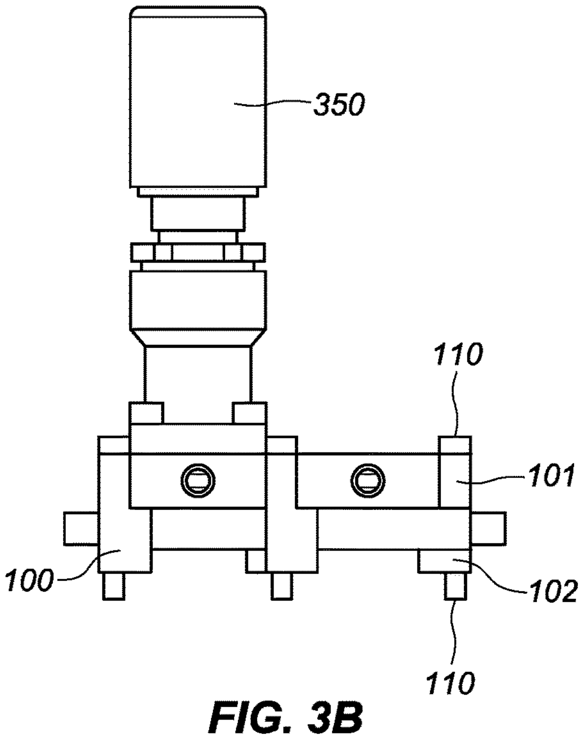
Figure 3C:
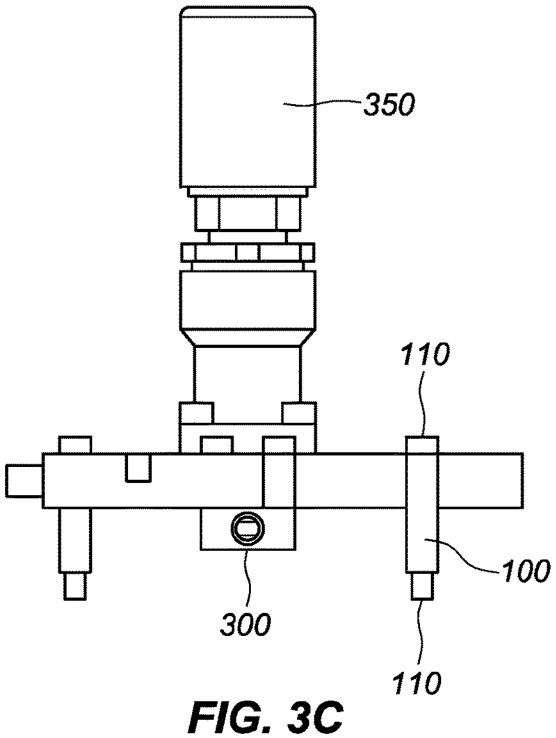

FIGS. 3A-3E illustrate various plan, perspective and end views of a portion of a fluid delivery system with which embodiments of the present disclosure may be used. For example, FIGS. 3D and 3E illustrate the manner in which fluid handling components 350, such as valves, pressure regulators, etc., may be mounted to a flow substrate 200B, and the manner in which the unitary mount body and the multi-part mount body may be used. As identified in the drawing of FIG. 3, the upper surface of the mount body is dimensioned to be below the top surface of the flow substrate 200B to ensure a leak tight seal may be formed between the fluid handling component and the component conduit ports formed in an upper surface of the flow substrate.

FIG. 4 illustrates two different isometric views of the manner in which embodiments of the present disclosure may be used to mount a fluid flow substrate 200B and the combination of a fluid flow substrate 200B and a manifold 300 to a support surface. In FIG. 4, unitary mount body 100 is used to mount the flow substrate 200B to a support surface and clamp 101 and stand-off 102 are used to mount the combination of flow substrate 200B and manifold 300 to a support surface.

FIG. 5 illustrates the manner in which a fluid flow substrate 200B and a manifold 300 may be aligned and attached to one another. As can be seen in FIG. 5, the fluid flow substrate 200B includes a manifold connection conduit port 205*b* that extends through the body of the fluid flow substrate and is fluidly connected to a component conduit port 205*a* (FIG. 4) on a top surface of the fluid flow substrate. The manifold connection conduit port 205*b* aligns with a manifold port 305*a* formed on an upper surface of the manifold 300 with a metal seal therebetween. When fully assembled, a port of the fluid handling component 350 is fluidly connected to the manifold port 305*a* by virtue of the passageway formed between component conduit port 205*a* and manifold connection conduit port 205*b*.

Figure 6:
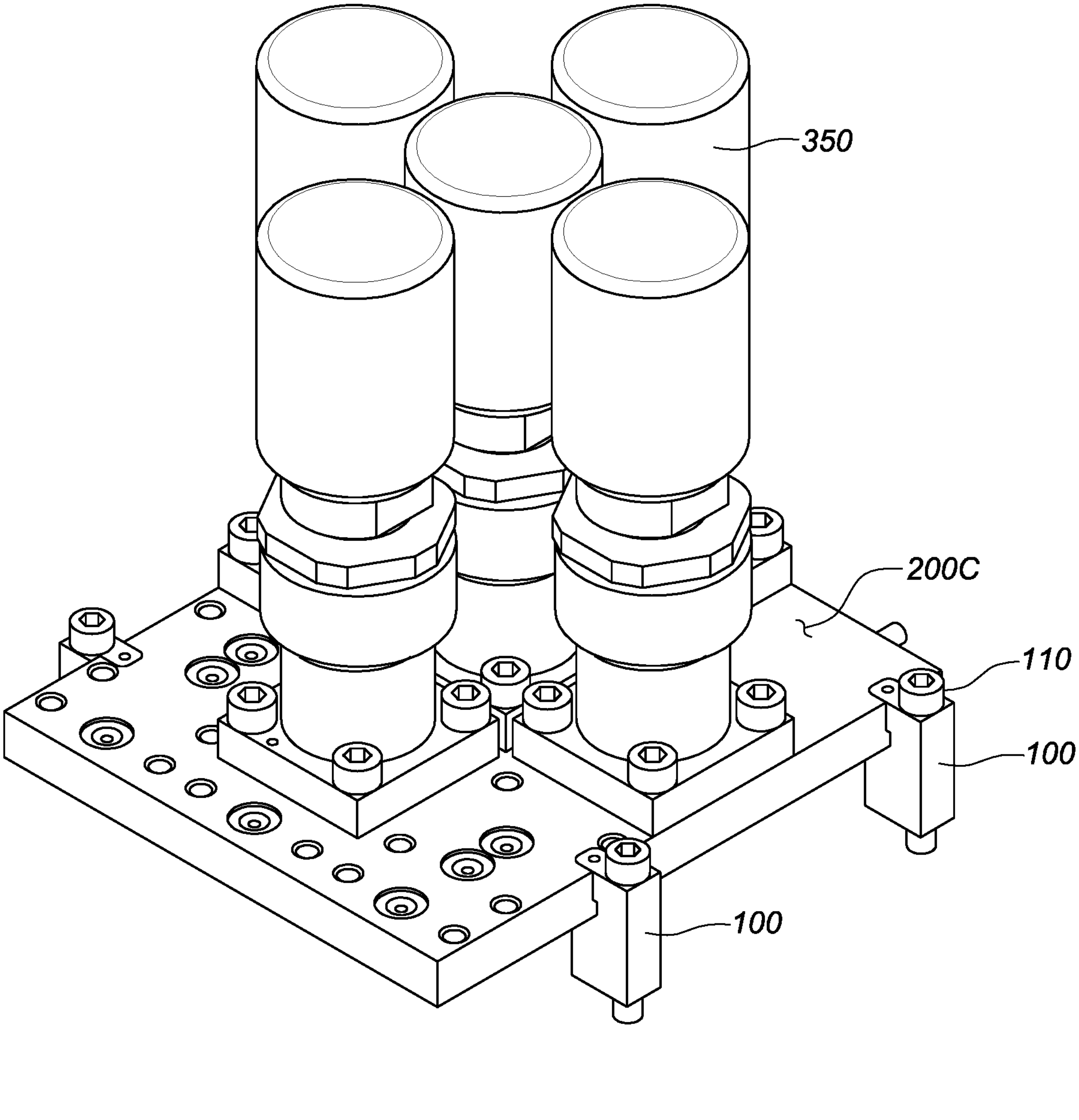
FIG. 6 illustrates the manner in which mounting structures of the present disclosure may be used with an integrated fluid flow substrate that may form part, or all of a fluid delivery panel, consistent with embodiments of the present disclosure.

FIG. 6 illustrates the manner in which mounting structures of the present disclosure may be used with an integrated fluid flow substrate that may form part, or all of a fluid delivery panel.

Figure 7A:
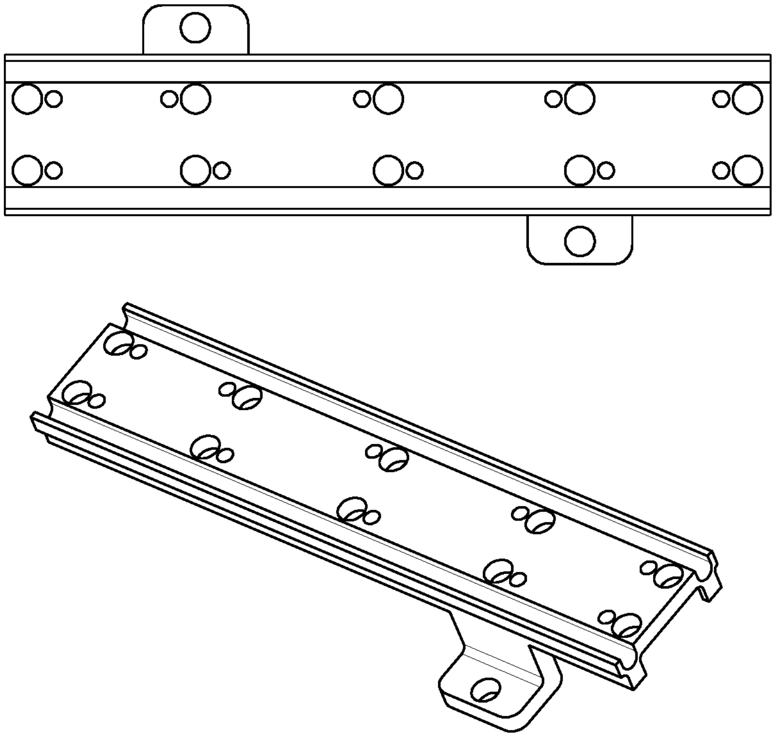
FIG. 7A illustrates fluid delivery stick brackets, such as those described in U.S. Pat. No. 8,496,029 B2, which are no longer needed in accordance with embodiments of the present disclosure.
Figure 7B:
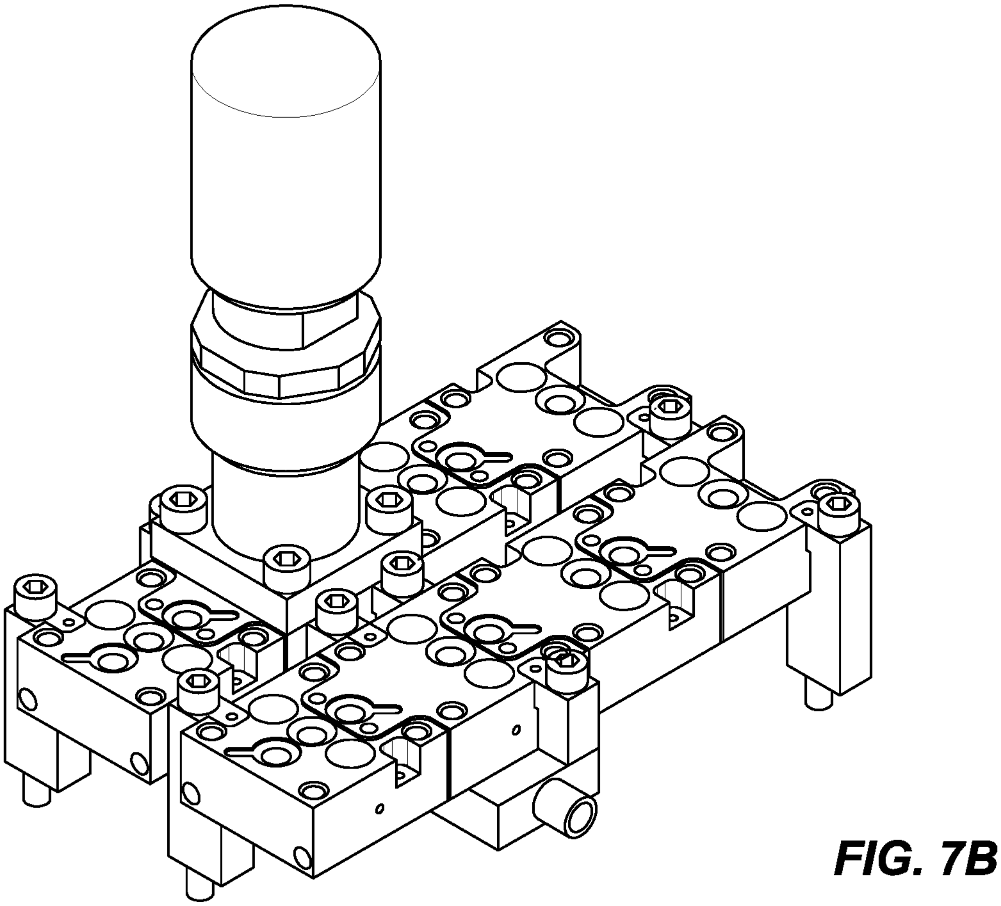
FIG. 7B illustrates how embodiments of the present disclosure may be used with conventional fluid delivery flow substrates and manifolds, such as K1S.

FIG. 7A illustrates fluid delivery stick brackets, such as those described in U.S. Pat. No. 8,496,029 B2, which are no longer needed in accordance with embodiments of the present disclosure. FIG. 7B illustrates how embodiments of the present disclosure may be used with conventional fluid delivery flow substrates and manifolds, such as K1S.

FIGS. 8A-J illustrate a modular flow substrate 800 to which one or more mounting structures of the present disclosure can be attached in accordance with an embodiment of the present disclosure. In an example, the modular flow substrate 800 can be used with fluid handling components having asymmetric port placement (e.g., C-seal components) in which one of the ports of the fluid handling component is axially aligned with the center of the fluid handling component and the other is situated off axis. Although not shown in the figures, it should be appreciated that embodiments of the present disclosure may be modified for use with fluid handling components have a symmetric port placement, such as W-Seal components.

As shown, the flow substrate 800 includes a substrate body 801 formed from a solid block of material and an associated cap 895 (see FIG. 8I), each of which may be formed from a suitable material (such as stainless steel, aluminum, brass, polymer, or the like) in accordance with the intended use of the flow substrate. The substrate 800 includes a component attachment surface 805 to which a fluid handling component (such as a valve, pressure transducer, filter, regulator, mass flow controller, etc.) can be attached. One or more component conduit ports 820 can be located in the component attachment surface 805 of the flow substrate 800. In the examples of FIGS. 8A-J, the component conduit port 820*a* can be fluidly connected to a first port (inlet or outlet) of a first fluid handling component, while component port 820*b* can be fluidly connected to the second port (outlet or inlet) of the first fluid handling component. A component conduit port 820*c* can be fluidly connected to the port (outlet or inlet) of a second fluid handling component that is distinct form the first fluid handling component.

Component conduit ports 820*c* and 820*d* and component conduit ports 820*e* and 820*f* would each be respectively connected to the inlet and outlet of a respective fluid handling component and illustrate how the flow substrate 800 is specifically suited to fluid handling components having asymmetric port placement. Component port 820*g* would typically be associated with the inlet or outlet port of a device, such as a mass flow controller, that might be used to communicate the flow of process fluid between flow substrates of a fluid delivery stick.

Associated with component conduit ports 820*a* and 820*b* are a plurality of internally threaded component mounting apertures 810*a*, 810*b*, 810*c*, and 810*d*, each of which would receive the threaded end of a fastener (not shown) that is used to sealingly mount a fluid handling component to the flow substrate 800. Associated with conduit port 820*g* are a pair of internally threaded component mounting apertures 810*y*, 810*z*, each of which would receive the threaded end of a fastener (not shown) to sealably mount a port of a fluid handling component, such as a mass flow controller to the flow substrate 800. It should be appreciated that an adjacent flow substrate in the fluid delivery stick would typically provide an additional pair of mounting apertures needed to sealably mount the other port of the fluid handling component to the adjacent flow substrate. Associated with each pair of component conduit ports is a leak port 825*a* (for component conduit ports 820*a* and 820*b*), and 825*b* (for component conduit ports 820*c* and 820*d*) that permits any leakage between the conduit ports and the respective fluid handling component to be detected.

The flow substrate 800 includes a number of fluid pathways 875*a*, 875*b*, 875*c*, and 875*d* that are used to convey fluid in a longitudinal direction (i.e., from left to right in FIG. 8A) along the flow substrate 800. For example, fluid pathway 875*a* extends between a tube stub connection 835 and component conduit port 820*a*, fluid pathway 875*b* extends between component conduit ports 820*b* and 820*c*, fluid pathway 875*c* extends between component conduit port 820*d* and component conduit port 820*e*, and fluid pathway 875*d* extends between component conduit port 820*f* and 820*g*. Tube stub connection 835 would typically be fluidly connected (for example, by welding) to a source or sink of process fluid.

A plurality of dowel pin apertures 850*a* through 850*h* are formed in the flow substrate 800 that extend from the component attachment surface 805 through to a connection attachment surface 815 on a side of the flow substrate opposing the component attachment surface 805. The connection attachment surface 815 may be used to connect the substrate 800 to a fluid delivery stick mounting structure, to a manifold, or both, such as described in U.S. Pat. No. 8,307,854 B1. Each of these dowel pin apertures 850*a*-850*h* can receive a dowel pin (not shown) that may be used to perform different functions. A first function can be to align the cap 895 with the body 801 of the flow substrate 800, and a second can be to align the flow substrate with a fluid delivery stick mounting structure in a manner similar to that described in U.S. Pat. No. 8,307,854 B1. It should be appreciated that in certain installations, only the first of these functions may be performed, such that after alignment (and welding as described further in detail below), the dowel pin may be removed and re-used with another flow substrate body and cap. In accordance with a further aspect of the present disclosure, the location of the dowel pin may be backwards compatible with existing modular flow substrate systems, for example, the K1S system.

Figure 8A:
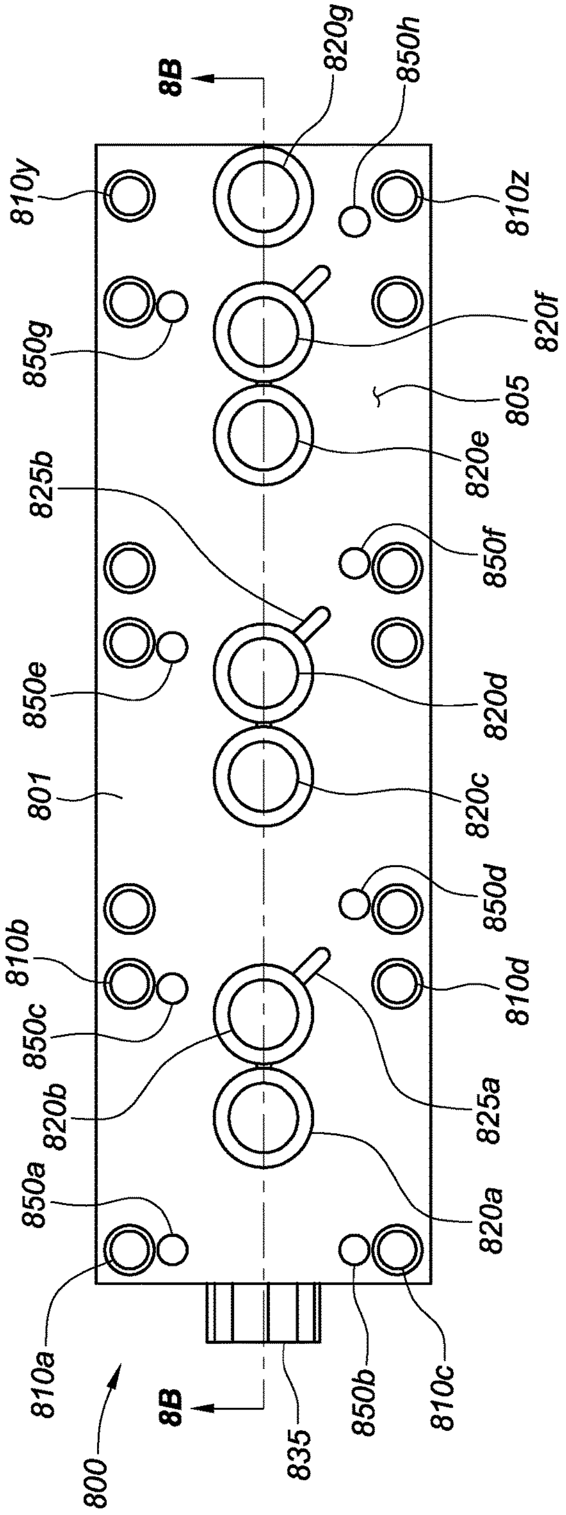
FIGS. 8A-J illustrate a modular flow substrate 800 to which one or more mounting structures of the present disclosure can be attached, consistent with embodiments of the present disclosure.
Figure 8B:
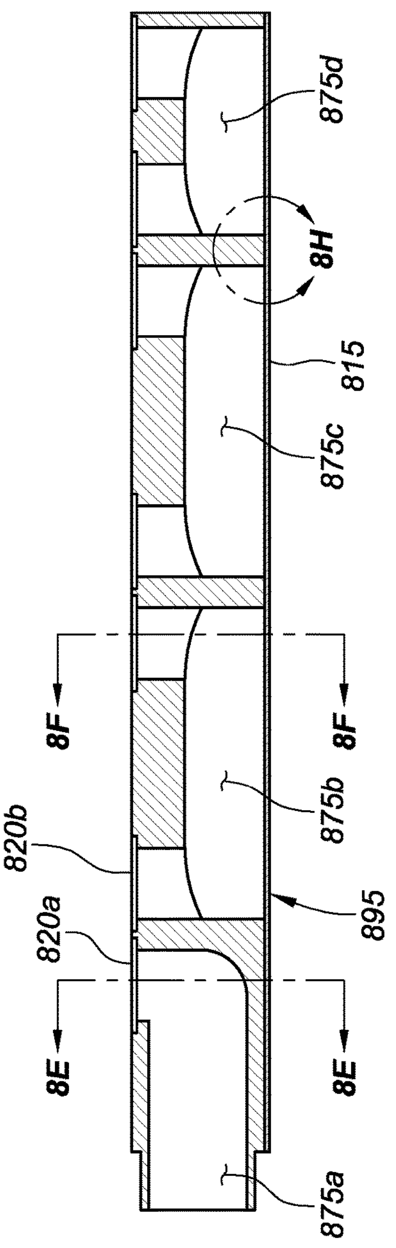
Figure 8C:
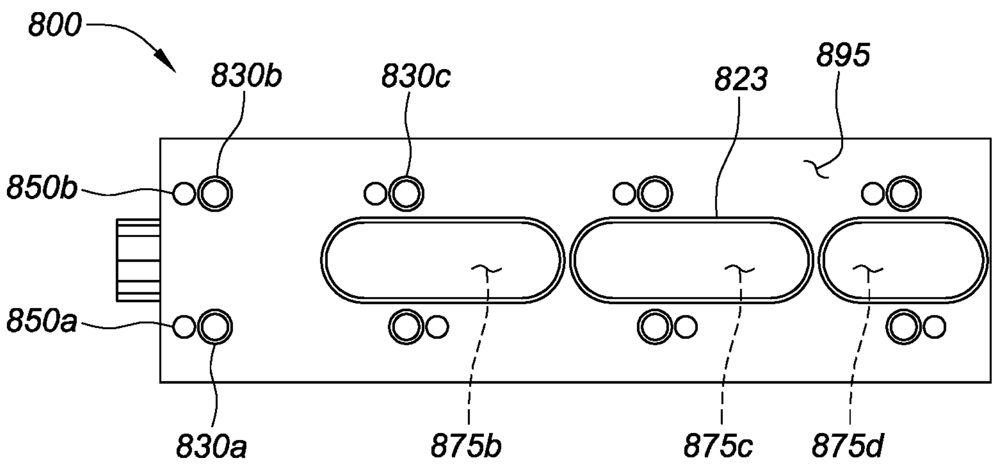
Figure 8D:
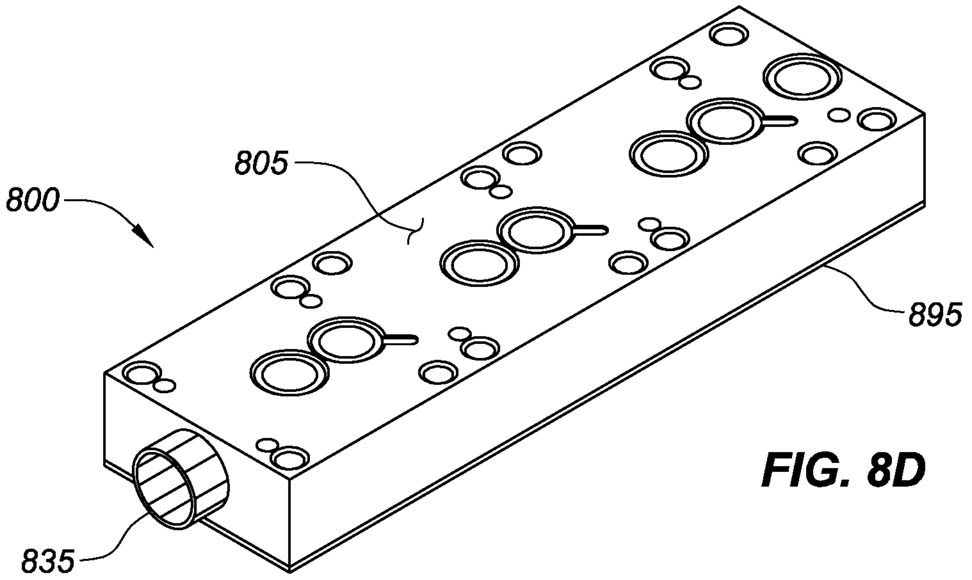

FIG. 8C illustrates a view of the flow substrate 800 from below in which a plurality of flow substrate mounting apertures 830 are visible. The plurality of flow substrate mounting apertures 830 can be formed in the cap 895 and extend through the cap 895 and into the body 801 of the flow substrate (shown more clearly in FIG. 8I). In some examples, where the cap 895 only covers a portion of the body 801, one or more of the plurality of flow substrate mounting apertures can be located in the body 801. Within the flow substrate body 801, the flow substrate mounting apertures 830 are internally threaded to receive a fastener (not shown) to mount the flow substrate 800 to a mounting surface, such as a fluid delivery stick mounting structure, from below. The placement of the flow substrate mounting apertures 830 may be varied depending upon the placement of mounting apertures in the mounting surface to which the flow substrate 800 is to be attached.

Figure 8E:
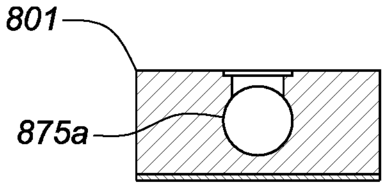
Figure 8F:
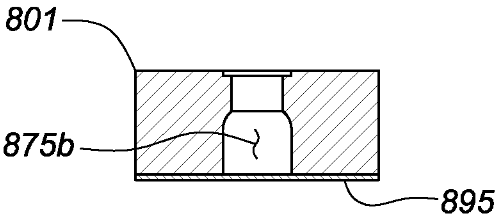
Figure 8G:
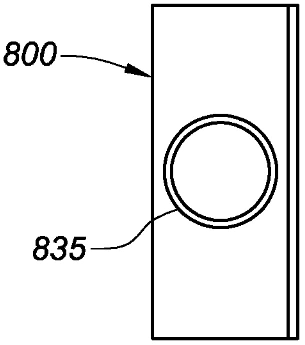

As can be seen in the figures, component conduit ports 820 and fluid pathways 875 can be machined in a cost-effective manner. Thus, component conduit ports 820*a*-820*g* may each be formed by machining from the component attachment surface 805 into a first or top surface of the body 801 of the flow substrate 800, fluid pathways 875*b*, 875*c*, and 875*d* may each be respectively formed by machining from a second or bottom surface of the body 801 of the flow substrate as shown in FIG. 8F, and fluid pathway 875*a* may be formed by machining from a side surface of the body of the flow substrate as shown in FIG. 8E. In some examples, the fluid pathways 875 may be treated to enhance their corrosion resistance. It should be appreciated that the dimensions of the fluid pathways 875 depicted in the figures are particularly well suited for higher flow rates, such as those above approximately 50 SLM (standard liters per minute). Indeed, the dimensions of the fluid pathways depicted in the figures permit the flow substrate 800 to be used in high flow rate applications (e.g., between approximately 50-100 SLM) as well as very high flow rate applications (e.g., those above approximately 200 SLM). Thus, the flow substrates may be used with emerging semiconductor manufacturing equipment that is designed to operate at very high flow rates between approximately 200 SLM to 1000 SLM. It should be appreciated that the dimensions of the fluid pathways may be scaled down for lower flow applications in a straightforward manner, for example, simply by reducing the cross-sectional area of one or more of the fluid pathways 875*b*, 875*c*, and 875*d*. Indeed, because the component conduit ports 820 are formed in a different process step than the fluid pathways, the dimensions of the fluid pathways are not constrained by the dimensions of the component conduit ports, and thus, the cross-sectional area of the fluid pathways may be significantly larger, smaller, or the same as that of the component conduit ports to accommodate a wide range of flow rates.

Figure 8H:
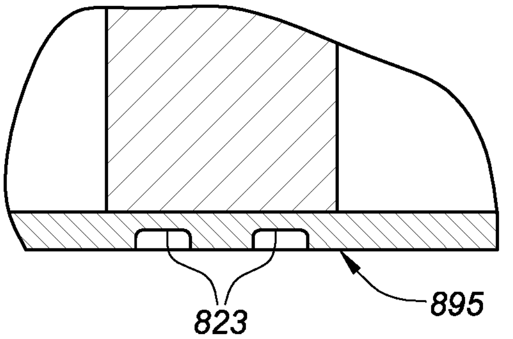
Figure 8I:
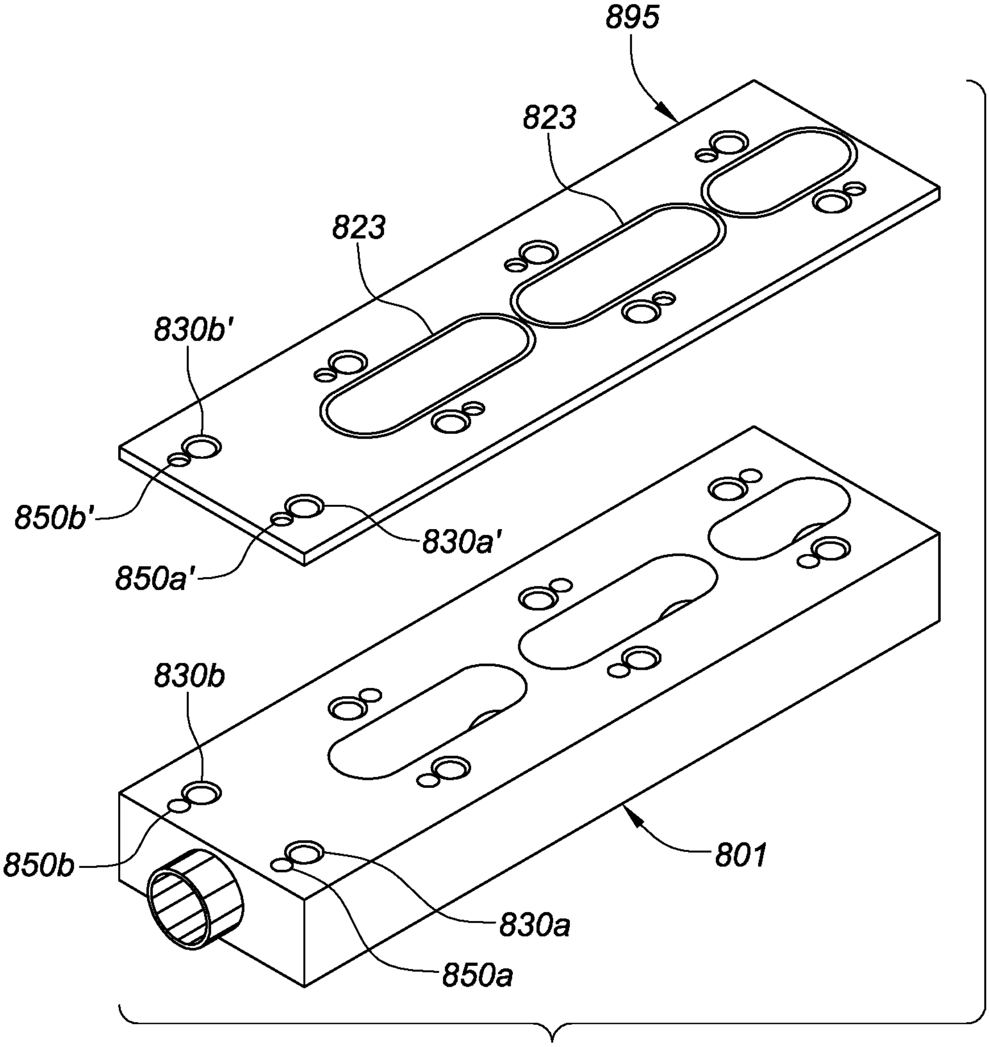
Figure 8J:
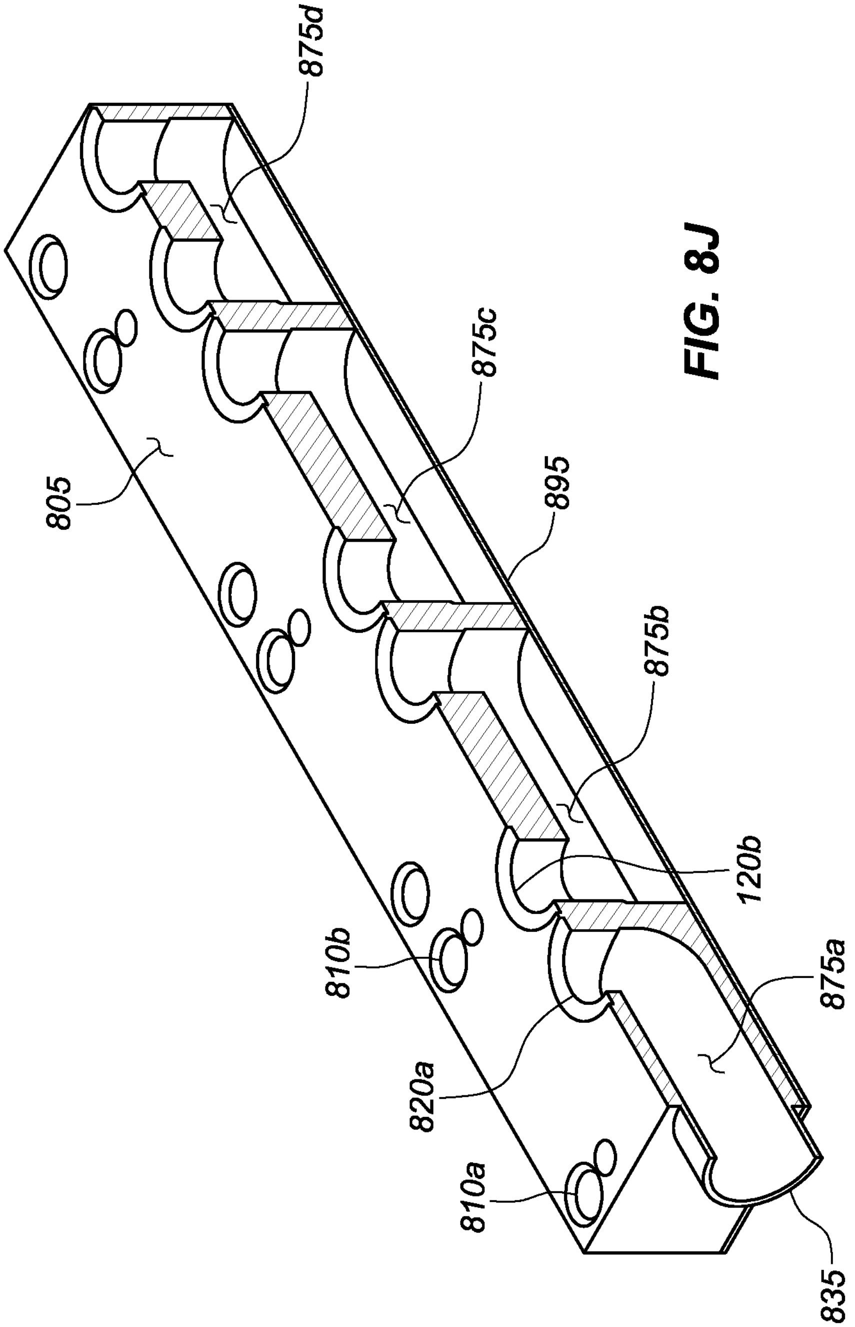

FIGS. 8H and 8I illustrate various details of the cap 895. In accordance with one embodiment that is specifically adapted for use with semiconductor process fluids that may frequently be heated to a temperature above ambient, the cap 895 can be formed from a thin sheet of stainless steel approximately 0.02 inches (0.5 mm) thick. The thinness of the sheet of stainless steel permits heat to be readily transferred to the process fluids flowing in the flow substrate by application of heat to the connection attachment surface 815 of the substrate. The source of heat may be provided by a block heater, by a cartridge heater inserted into a groove of a fluid delivery stick mounting structure to which the flow substrate is attached in a manner similar to that described in U.S. Pat. No. 8,307,854 B1, or by a thin film heater, such as that described in U.S. Pat. No. 7,307,247. It should be appreciated that the thinness of the cap also permits fluid flowing in the flow substrate to be cooled, should that be desired.

The sheet of stainless steel may be chemically etched to form groves 823 that surround and define the fluid pathways 875*b*, 875*c*, and 875*d*. Such chemical etching may be accurately performed, and can be less expensive than other method of forming groves, such as by machining, which may alternatively be used. In accordance with one embodiment, the groves may be etched to a thickness of approximately 0.01 inches (0.25 mm). The presence of the grooves 823 surrounding and defining each fluid pathway 875*b*, 875*c*, and 875*d* can serve a number of purposes. For example, the thinness of the grooves permits the cap to be welded to the body 801 of the flow substrate 800, for example, by electron beam welding, using less time and energy than if the grooves 823 were not present. The welding would be performed by tracing around each fluid pathway defined by the groove, thereby forming a fluid tight seal. The electron beam welding may be performed in a vacuum environment to minimize any contamination. Where the materials being used for the flow substrate body 801 and cap 895 are high purity metals, such as stainless steel, the vacuum welding environment acts to further eliminate contaminants (such as Carbon, Sulfur, Manganese, etc.) at the point of the weld. Although electron beam welding is generally preferred, it should be appreciated that other types of welding, such as laser welding may also be used.

The presence of the grooves 823 also serves as a guide during welding, since the grooves define the periphery of the fluid pathway. Dowel pin holes 850*a*, 850*b* in the body 801 of the flow substrate and corresponding dowel pin holes 850*a*', 850*b*' in the cap 895 receive a dowel pin that permits the cap 895 to be aligned with and held in registration with the body of the flow substrate 800 during welding. The dowel pins may be removed and re-used after welding is complete, or kept in place as an aid for aligning the flow substrate with a mounting surface.

In various examples, the flow substrate can also include other configurations, such as those illustrated and discussed in U.S. Pat. No. 8,496,029 B2. It should be appreciated that although only four fluid pathways are illustrated in the figures, the ease and low cost of manufacturing embodiments of the present disclosure readily permits any number of fluid pathways and component ports to be defined in the flow substrate. In this regard, all of the fluid pathways and component connection ports for an entire fluid delivery stick may be formed in a single flow substrate. Alternatively, a fluid delivery stick may be formed by using two or more flow substrates such as the flow substrate 800 described above.

Figure 9A:
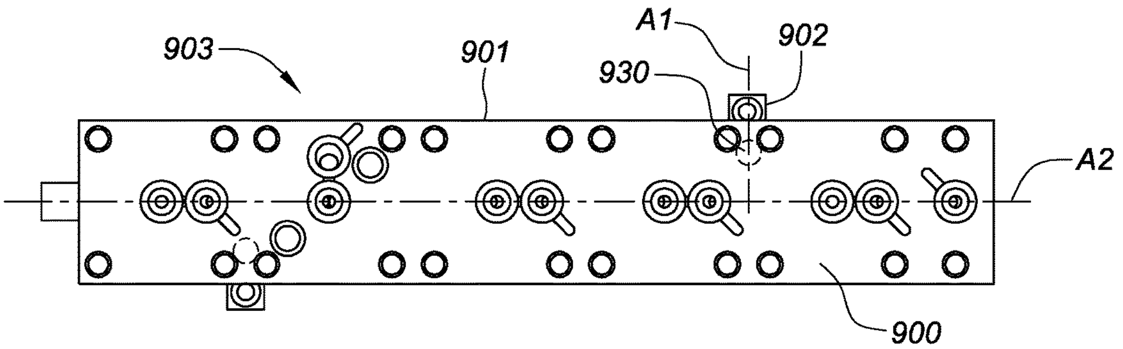
FIG. 9A depicts an upper view of an example of a flow substrate coupled to a substrate mounting structure, consistent with embodiments of the present disclosure.

FIG. 9A depicts an upper view of an example of a flow substrate 900 coupled to a substrate mounting structure 902. In the examples illustrated herein, the mounting structure, such as mounting structure 902, can be removably coupled to the flow substrate 900. FIG. 9B1 illustrates a perspective view of the mounting structure 902, FIG. 9C depicts a cross section view of the mounting structure 902, and FIG. 9D illustrates a bottom view of the mounting structure 902.

As shown in the examples of FIGS. 9B1-9D, the mounting structure 902 can include a first aperture 904A and a second aperture 904B. The first aperture 904A and the second aperture 904B can be configured for fastening the mounting structure 902 between the flow substrate 900 and a support surface. A first fastener can be located through the first aperture 904A to secure the mounting structure 902 to the flow substrate 900, and a second fastener can be located through the second aperture 904B to secure the mounting structure 902 to a support surface, back-up plate, a fluid delivery stick mounting structure, a manifold, or a combination thereof, for instance as described further in U.S. Pat. No. 8,307,854 B1. In an example, the fasteners can be engaged with respective mounting apertures 930 (e.g., apertures 830 as described further herein) of the flow substrate 900 to attach the mounting structure 902 to the flow substrate 900. The fastener can include, but is not limited to, a bolt, screw, quick-release connection (e.g., bayonet or other ¼ turn fastener), rivet, snapfit, latch, or the like. Accordingly, the mounting structure 902 can support the flow substrate 900 along the support surface.

Figure 9C:
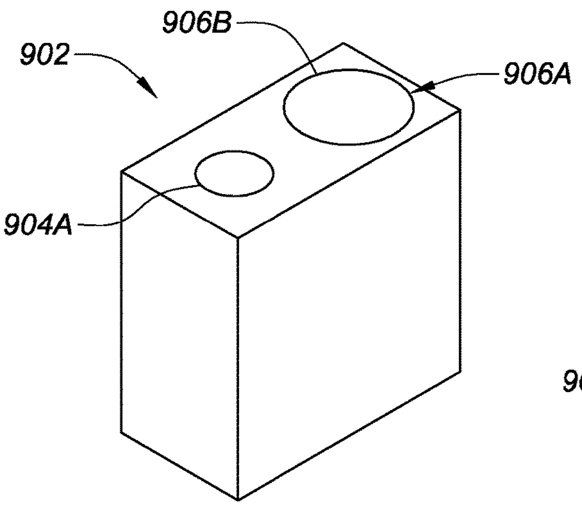
FIG. 9C depicts a cross sectional view of the mounting structure of FIGS. 9A-B1, consistent with embodiments of the present disclosure.
Figure 9C:
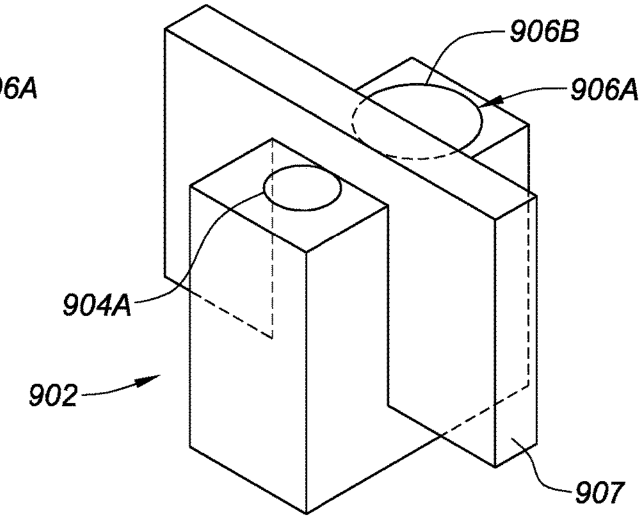
Figure 9C:
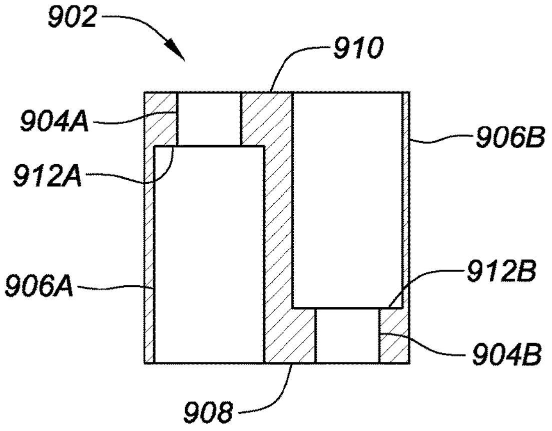
Figure 9D:
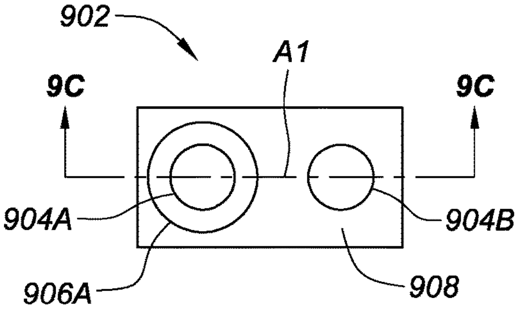
FIG. 9D illustrates a bottom view of the mounting structure of FIGS. 9A-B1, consistent with embodiments of the present disclosure.

As illustrated in the example of FIG. 9C, the first aperture 904A, the second aperture 904B, or both, can include a countersink or a counterbore, as shown in the example of FIG. 9C. A first counterbore 906A can be located on a first end 908 of the mounting structure 900, and a second counter bore 906B can be located on a second end 910 of the mounting structure 900. The second end 910 can interface with the flow substrate 900, such as the body or the cap of the flow substrate 900. In other words, as shown in the example of FIGS. 9A-D, the first aperture 904A can be oriented in an opposing direction to the second aperture 904B. A bearing surface can be provided by the internal end of the counterbore. For example, the first fastener can clamp the mounting structure 902 to the flow substrate 900 between the second end 910 and the first bearing surface 912A. The second fastener can clamp the mounting structure 902 to the support surface or other mounting surface between the first end 908 and the second bearing surface 912B.

In an example, the one or more mounting structures, such as mounting structure 902, can support the flow substrate 900 at a distance from the support surface. For instance, a height H of the mounting structure 902 can position the flow substrate at a distance above the support surface. The distance can be configured for providing airflow for heat transfer or for routing fluid lines or manifolds between the flow substrate 900 and the support surface.

In various examples, the flow substrate 900 can cover a portion of the second aperture 904B or the second counterbore 906B, when the mounting structure 902 is coupled (e.g., fastened) to the flow substrate 900, as depicted in FIG. 9A. For instance, when the mounting structure 902 is attached to the flow substrate 900, the flow substrate 900 can capture the fastener within the mounting structure 902. In the example of FIG. 9B1, the fastener can be captured between the second end 910 of the mounting structure 902 and the bearing surface 912B of the counterbore 906B.

In an example, the longitudinal axis of the second aperture 904B (and correspondingly the second fastener) can be located at an offset distance from the side 901 of the flow substrate 900 to facilitate access of a tool for interfacing with a head of the fastener. The head of the fastener can include a screw drive, such as a hexagonal, hexalobular internal (Torx®), or other type of screw drive. In an example, the longitudinal axis of the aperture can be offset from the side 901 by at least the radius of the corresponding screw drive of the fastener. The radius of the head of the fastener can be greater than the offset distance so the fastener can be captured within the mounting structure 902 (e.g., within the counterbore 906B of the aperture 904B) by the flow substrate 900. A fluid delivery stick 903 can be pre-assembled by coupling one or more of the mounting structures 902 with the flow substrate 900. Accordingly, when the flow substrate 900 is coupled with the mounting structure 902, the fastener used for securing the mounting structure 902 (and correspondingly the flow substrate 900) to the support surface can be retained within the mounting structure 902 by a portion of the flow substrate 900 (see FIG. 9A) where the head of the fastener remains accessible by a tool. The pre-assembled configuration with the fastener retained by in the mounting structure by the flow substrate is beneficial, for instance during transportation or installation. Retaining the fastener within the mounting structure prevents the fastener from being misplaced, or from being replaced or modified by the customer. In another example, the fastener can be recessed or partially recessed within the mounting structure, such as recessed with respect to the upper surface of the flow substrate.

In a further example, the mounting structure 902 can be aligned with the flow substrate 900. For instance, a fixture 907 can be used to align the mounting structure 902 with the flow substrate 900. In the examples of FIGS. 9A-D, the longitudinal axis A1 of the mounting structure 902 can be configured at a perpendicular angle to the longitudinal axis A2 (e.g., along the primary direction of flow) of the flow substrate 900. The fixture 907, as shown in FIG. 9B2 can align the mounting structure 902 at a 90° angle with the flow substrate 900. In other examples, the longitudinal axis A1 or other axis of the mounting structure 902 can be configured in other orientations with respect to the longitudinal axis A2 of the flow substrate 900, such as at a 30 degree, 45 degree, 60 degree, or other angle therebetween. A fastener, such as the first fastener located through the first aperture 904A, can fix the location and orientation of the mounting structure 902 with respect to the flow substrate 900. In some examples, the fixture can ensure proper alignment of the mounting structure 902 (from the manufacturer) to mitigate improper installation or customer modification. Other examples of aligning the mounting structure 902 with the flow substrate 900 are described in the further examples of FIGS. 10A-E, 11A-D, 12A-E, 13A-E, and 14A-D.

A fluid delivery stick 903 (as depicted in the examples of FIGS. 9A-D, 10A-E, 11A-D, 12A-E, 13A-E, and 14A-D) can include a flow substrate 900 and one or more mounting structures (such as the mounting structure 902 or other mounting structures described herein and shown in the examples of FIG. 10A-E, 11A-D, 12A-E, 13A-E, or 14A-D) coupled to the flow substrate 900. A respective fastener can be captured within the mounting structure 902 for attaching the fluid delivery stick 903 to the support surface. Accordingly, all of the hardware for attaching the mounting structure 902 to the support surface can be included in the fluid delivery stick 903. The mounting structure 902 can be located and aligned with respect to the flow substrate 900 for installation on the support surface.

Figure 10A:
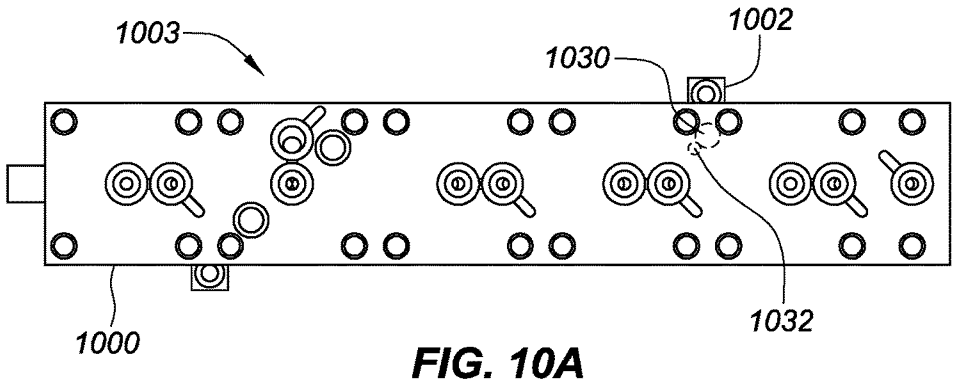
FIGS. 10A-E depict another example of a mounting structure, consistent with embodiments of the present disclosure.
Figure 10B:
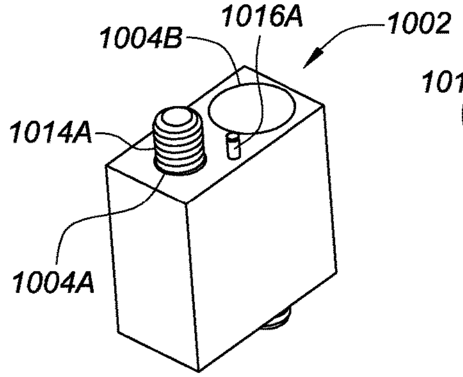

FIGS. 10A-E depict another example of a mounting structure 1002. The mounting structure 1002 can include a first aperture 1004A, a second aperture 1004B, a first counterbore 1006A, and a second counterbore 1006B as arranged and described in the examples of FIGS. 9A-D and further described herein. A fastener 1014A can be inserted inside of the first aperture 1004A as illustrated in the example of FIG. 10B. One or more fasteners, such as the fastener 1014A, can couple the mounting structure 1002 to the flow substrate 1000. For instance, the flow substrate 1000 can include one or more mounting apertures 1030, as previously described. The fastener 1014A can secure the mounting structure 1002 to the flow substrate 1000 using the mounting aperture 1030.

Figure 10C:
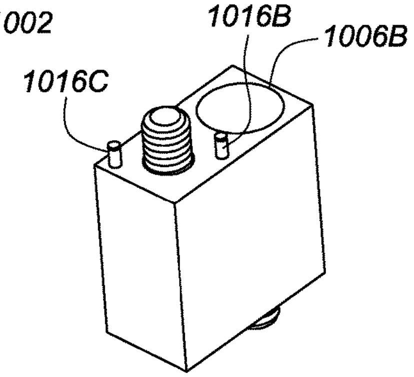
Figure 10D:
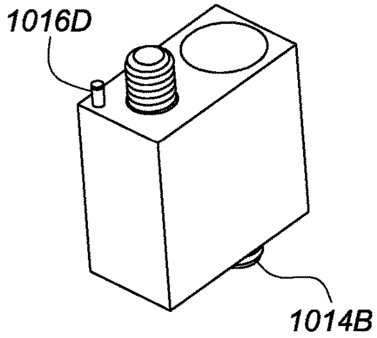

The mounting structure 1002, the flow substrate 1000, or both can include one or more alignment features to align the mounting structure 1002 with the flow substrate 1000. In the examples of FIGS. 10B-E, the alignment features can be alignment pins 1016A-D. The flow substrate 1000 can include one or more alignment apertures 1032 located in a cap (e.g., cap 195 depicted in FIGS. 8B, D-E, H-J and described herein), a body of the flow substrate 1000, or both. The one or more alignment apertures 1032 can be positioned on the flow substrate 1000 to align the mounting structure 1002 with respect to the flow substrate 1000 when the corresponding alignment pins 1016A-D of the mounting structure 1002 are engaged with the mounting apertures 1032. The example of FIG. 10B depicts a single alignment pin 1016A located on a first side of the first aperture 1004A, the example of FIG. 10D illustrates an alignment pin 1016D located on a second side of the aperture 1004A, and the example of FIG. 10C depicts an alignment pin 1016B located on a first side of the first aperture 1004A and a second alignment pin 1016C located on a second, opposing, side of the first aperture 1004A. The alignment feature of the mounting structure 1002 or the flow substrate 1000 can mitigate or eliminate the need for an alignment fixture to position or orient the mounting structure 1002 with respect to the flow substrate 1000. In other examples, one or more alignment apertures can be located on the mounting structure 1002 and one or more corresponding alignment pins can be located on the flow substrate 1000 or a combination of various alignment pins and apertures. Other alignment features are also contemplated. Some further examples of alignment features are shown in the examples of FIGS. 11B-C, 12B-E, and 13B-E and described further herein.

Figure 10E:
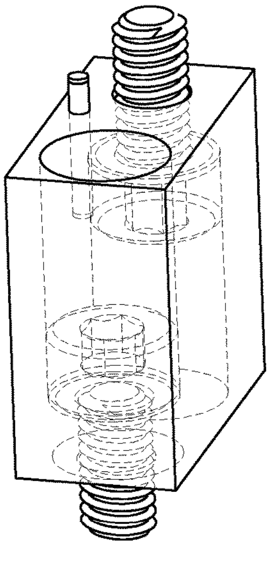

FIG. 10E illustrates an example of the mounting structure 1002 including the fastener 1014A and a fastener 1014B inserted into each of the respective first aperture 1004A and second aperture 1004B. When the mounting structure 1002 is coupled to the flow substrate 1000, the flow substrate 1000 can cover or partially cover the aperture 1004B, such as the counterbore 1006B of the aperture 1004B, to capture the fastener 1014B within the aperture 1004B. Accordingly, as previously described, the fastener 1014B can be retained within the fluid delivery stick 1003 (depicted in FIG. 10A), such as during transport or installation. In another example, the fastener 1014B can be recessed or partially recessed within the mounting structure 1002, such as recessed with respect to the upper surface of the flow substrate 1000.

Figure 11A:
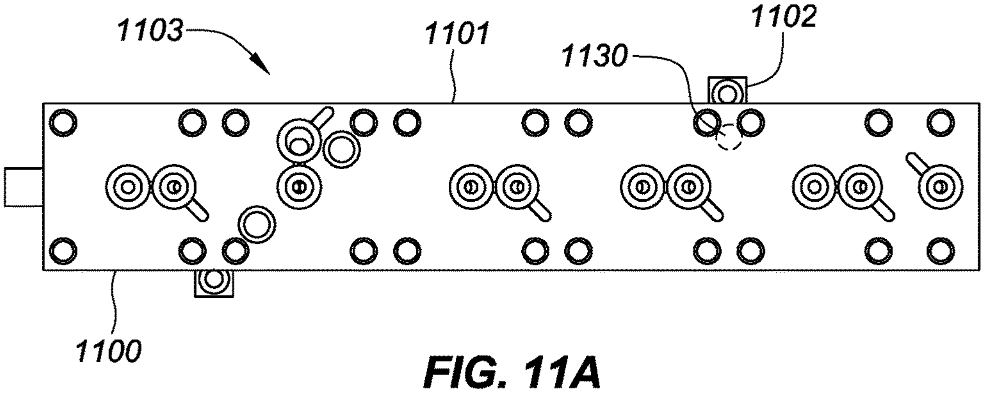
FIGS. 11A-D illustrate another example of a mounting structure, consistent with embodiments of the present disclosure.
Figure 11B:
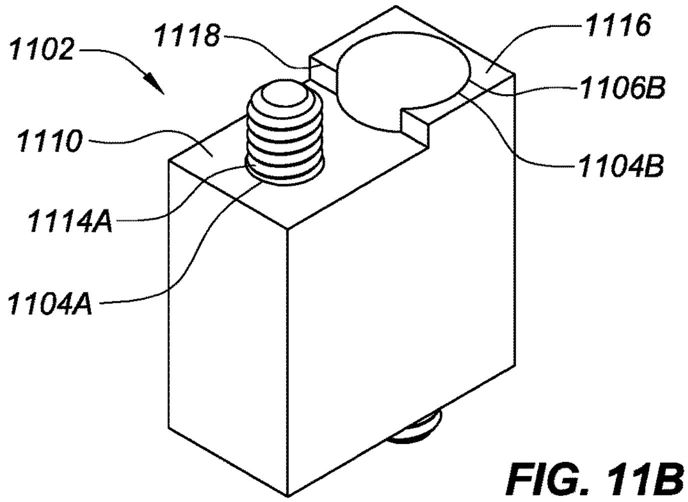
Figure 11C:
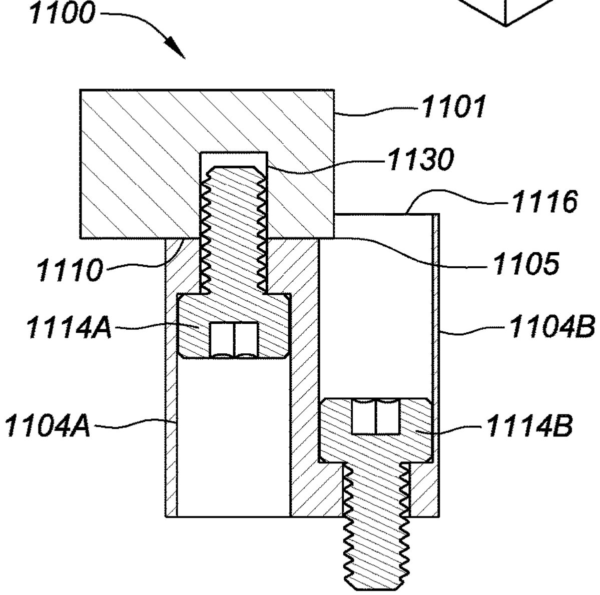
Figure 11D:
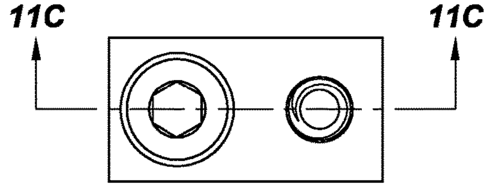

FIGS. 11A-D illustrate another example of a mounting structure 1102. The mounting structure 1102 can include a first aperture 1104A, a second aperture 1104B, a first counterbore 1106A, and a second counterbore 1106B as arranged and described in the examples of FIGS. 9A-D, and 10A-E. A fastener 1114A can be inserted inside of the first aperture 1104A as illustrated in the example of the perspective view in FIG. 11B and the cross section view of FIG. 11C. One or more fasteners, such as the fastener 1114A, can couple the mounting structure 1102 to the flow substrate 1100. For instance, the flow substrate 1100 can include one or more mounting apertures 1130, as previously described. The fastener 1114A can secure the mounting structure 1102 to the flow substrate 1100 using the mounting aperture 1130. FIG. 11D illustrates a bottom view of the mounting structure 1102.

As shown in the examples of FIGS. 11B-C, the mounting structure 1102 can include an alignment feature, such as a step 1116 along one end (e.g., a second end 1110) of the mounting structure 1102 that interfaces with a flow substrate 1100 proximate a flow substrate edge portion 1105 of the flow substrate 1100. For instance, the step 1116 can include a raised portion of the second end 1110 of the mounting structure 1102. A raised edge 1118 of the step 1116 can engage with the flow substrate 1100 proximate the flow substrate edge portion 1105, for instance along a side face 1101 adjacent to the flow substrate edge portion 1105 of the flow substrate 1100. The step 1116 can be configured to align the mounting structure 1102 with respect to the flow substrate 1100. For example, the step 1116 can be configured at an angle, such as 90 degrees, 60 degrees, 45 degrees, 30 degrees, or other angle between 10 degrees and 90 degrees with respect to a longitudinal axis of the mounting structure 1102 (e.g., an axis along the second end 1110 and extended through the central axes of the first aperture 904A and the second aperture 904B). In another example, the step 1116 can be located on the flow substrate 1100 to align the mounting structure 1102 with respect to the flow substrate 1100. The alignment feature (step 1116) of the mounting structure 1102 or the flow substrate 1100 can mitigate or eliminate the need for an alignment fixture to position or orient the mounting structure 1102 with respect to the flow substrate 1100.

The raised edge 1118 of the step 1116 can be located along at least a portion of the second aperture 1104B or at least a portion of the second counterbore 1106B of the aperture 1104B, as depicted in FIGS. 11B-C. FIG. 11C illustrates an example of a cross section the mounting structure 1102 including a fastener 1114A inserted into the first aperture 1104A and a second fastener 1114B inserted into the second aperture 1104B. When the mounting structure 1102 is coupled to the flow substrate 1100, the flow substrate 1100 can cover or partially cover the second aperture 1104B, such as the counterbore 1106B of the second aperture 1104B, to capture the fastener 1114B within the second aperture 1104B. Accordingly, as previously described, the fastener 1114B can be captured within the flow substrate system 1100, such as during transport or installation. In another example, the fastener 1114B can be recessed or partially recessed within the mounting structure 1102, such as recessed with respect to the upper surface of the flow substrate 1100.

Figure 12A:
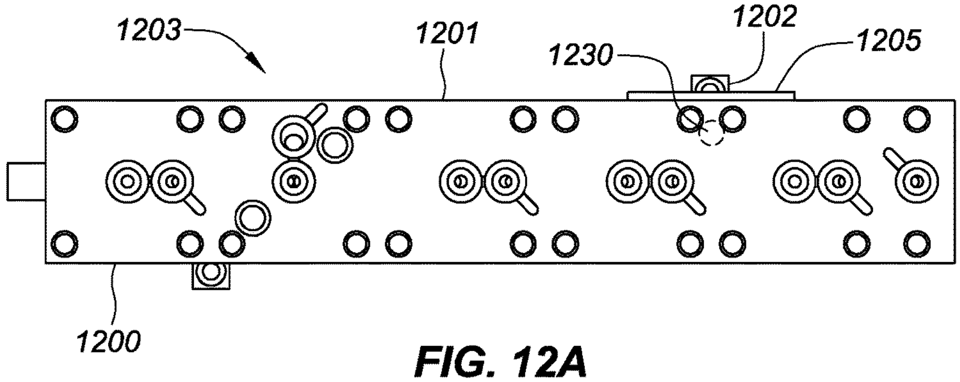
FIGS. 12A-E illustrate another example of a mounting structure, consistent with embodiments of the present disclosure.
Figure 12B:
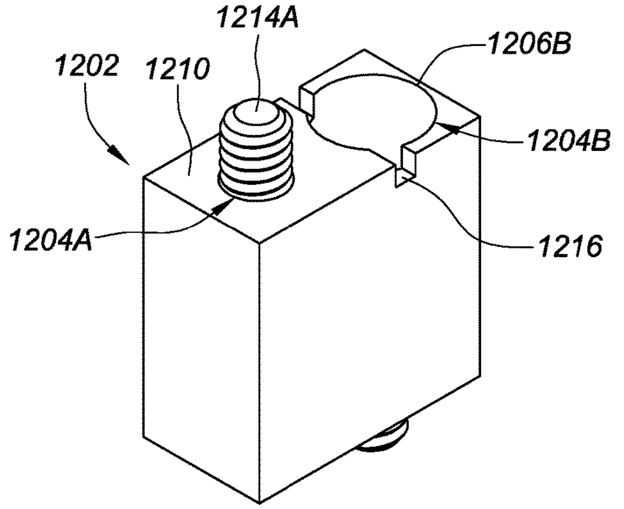
Figure 12C:
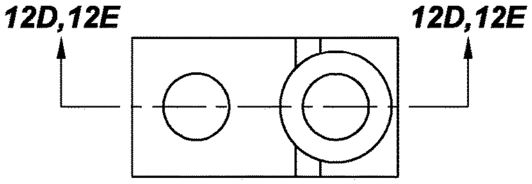
Figure 12E:
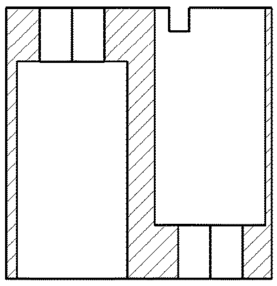

FIGS. 12A-E illustrate another example of a mounting structure 1202. The mounting structure 1202 can include a first aperture 1204A, a second aperture 1204B, a first counterbore 1206A, and a second counterbore 1206B as arranged and described in the examples of FIGS. 9A-D, 10A-E, and 11A-D. A fastener, such as fastener 1214A, can be inserted inside of the first aperture 1204A as illustrated in the example of the perspective view in FIG. 12B and the cross section view of FIG. 12D. One or more fasteners, such as the fastener 1214A, can couple the mounting structure 1202 to the flow substrate 1200. For instance, the flow substrate 1200 can include one or more mounting apertures 1230, as previously described. The fastener 1214A can secure the mounting structure 1202 to the flow substrate 1200 using the mounting aperture 1230. FIG. 12C illustrates a bottom view of the mounting structure 1202, and FIG. 12E illustrates another cross section view of the mounting structure 1202 without the fastener 1214A or fastener 1214B.

As shown in the examples of FIGS. 12B-E, the mounting structure 1202 can include an alignment feature, such as a slot 1216 along one end (e.g., a second end 1210) of the mounting structure 1202. For instance, the slot 1216 can extend through a thickness of the second end 1210 of the mounting structure 1202 as shown in the example of FIG. 12B. In an example, a fixture 1205 can be used to orient the mounting structure 1202 with respect to the flow substrate 1200. For instance, the fixture 1205 can include a plate positioned along the side of the flow substrate 1200. The fixture 1205 can include an edge that extends below the lower surface of the flow substrate 1200. The fixture 1205 can be inserted or engaged within the slot 1216. When the fixture 1205 is located within the slot 1216, the slot 1216 can be correspondingly aligned with the side 1201 of the flow substrate 1200, and accordingly, the mounting structure 1202 can be aligned with respect to the flow substrate 1200. Following alignment and attachment of the mounting structure 1202, the fixture can be removed from the fluid delivery stick 1203. In another example, the flow substrate 1200 can include a flange or other engagement feature to interface with the slot 1216 to align the mounting structure 1202 with respect to the flow substrate 1200. In some examples, the fixture 1205 can ensure proper alignment from the manufacturer and mitigate improper installation or customer modification. The slot 1216 can be configured to align the mounting structure 1202 with respect to the flow substrate 1200. For example, the slot 1216 can be configured at an angle, such as 90 degrees, 60 degrees, 45 degrees, 30 degrees, or other angle between 10 degrees and 90 degrees with respect to a longitudinal axis of the mounting structure 1202 (e.g., an axis along the second end 1210 and extended through the central axes of the first aperture 1204A and the second aperture 1204B).

Figure 12D:
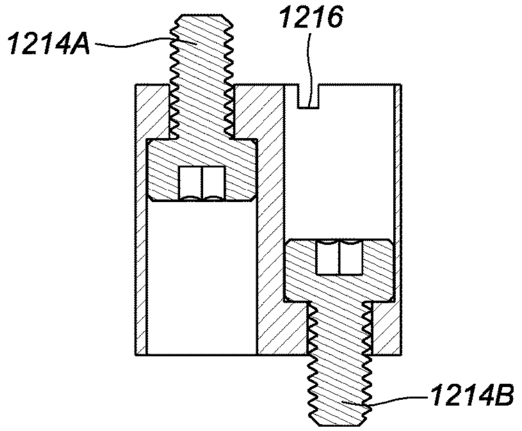

The slot 1216 can be located along at least a portion of the second aperture 1204B or at least a portion of the second counterbore 1206B of the aperture 1204B, as depicted in FIGS. 12B-E. FIGS. 12D, E illustrate examples of a cross section the mounting structure 1202. FIG. 12D depicts a fastener 1214A inserted into the first aperture 1204A and a second fastener 1214B inserted into the second aperture 1204B. When the mounting structure 1202 is coupled to the flow substrate 1200, the flow substrate 1200 can cover or partially cover the second aperture 1204B, such as the counterbore 1206B of the second aperture 1204B, to capture the fastener 1214B within the second aperture 1204B. Accordingly, as previously described, the fastener 1214B can be captured within the fluid delivery stick 1203, such as during transport or installation. In another example, the fastener 1214B can be recessed or partially recessed within the mounting structure 1202, such as recessed with respect to the upper surface of the flow substrate 1200.

Figure 13A:
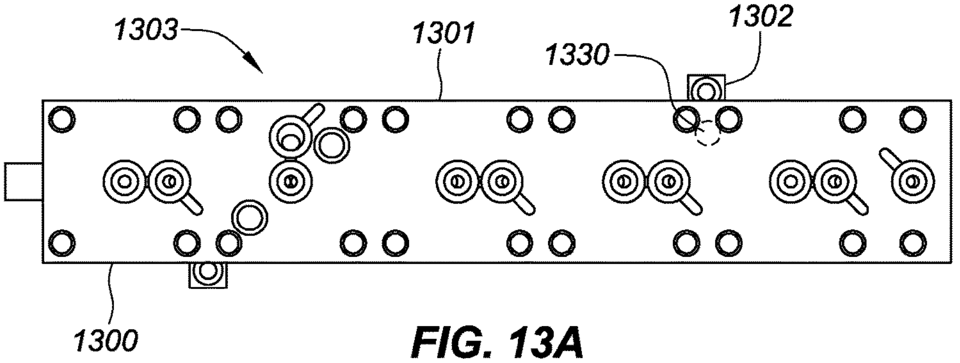
FIGS. 13A-E illustrate examples of a mounting structure including an alignment frame for orienting and supporting the mounting structure with respect to a flow substrate, consistent with embodiments of the present disclosure.
Figure 13B:
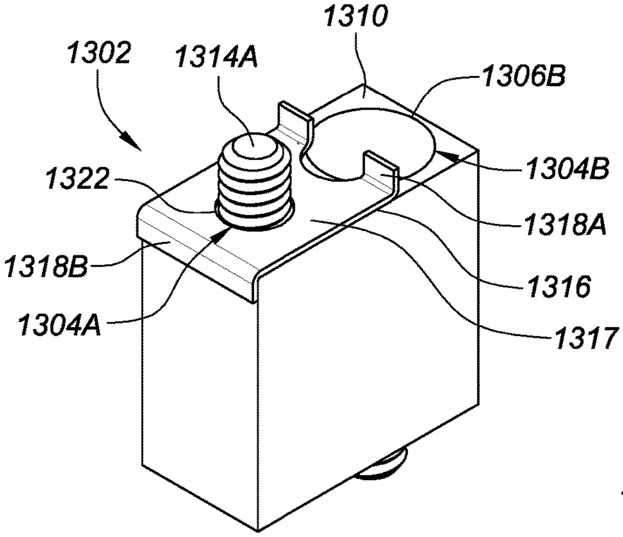
Figure 13C:
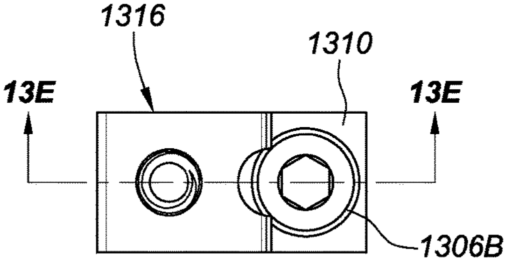
Figure 13D:
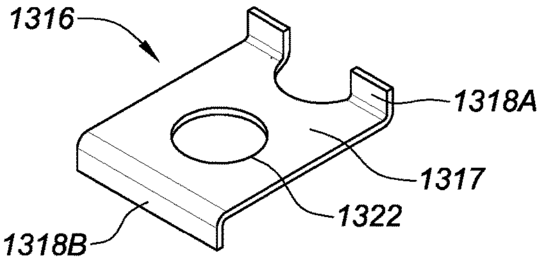

FIGS. 13A-E illustrate examples of a mounting structure 1302 including an alignment frame (i.e., alignment clip) 1316 for orienting and supporting the mounting structure 1302 with respect to a flow substrate 1300. In other words, an alignment feature can include the alignment frame 1316 coupled between the flow substrate 1300 and the mounting structure 1302. The mounting structure 1302 can include a first aperture 1304A, a second aperture 1304B, a first counterbore 1306A, and a second counterbore 1306B as arranged and described in the examples of FIGS. 9A-D, 10A-E, 11A-D, and 12A-E. A fastener, such as fastener 1314A, can be inserted inside of the first aperture 1304A as illustrated in the example of the perspective view in FIG. 13B and the cross section view of FIG. 13E. One or more fasteners, such as the fastener 1314A, can couple the mounting structure 1302 to the flow substrate 1300. For instance, the flow substrate 1300 can include one or more mounting apertures 1330, as previously described. The fastener 1314A can secure the mounting structure 1302 to the flow substrate 1300 using the mounting aperture 1330. FIG. 13C illustrates a top view of the mounting structure 1302.

The alignment frame 1316 can be placed on to the mounting structure 1302, such as on the second end 1310 of the mounting structure 1302. An aperture 1322 can be located in the alignment frame 1316. When the first fastener 1314A is located within the first aperture 1304A, the first fastener 1314A can be located through the aperture 1322 to engage with the mounting aperture 1330 to couple the mounting structure 1302 to the flow substrate 1300. In an example, the aperture 1322 can allow the fastener 1314A to register the location of the alignment frame 1316 on the mounting structure 1302. As shown in the examples of FIGS. 13B-E, the alignment frame 1316 can include a first flange 1318A and a second flange 1318B. In some examples, the alignment frame 1316 can be constructed from materials including, but not limited to, metal or polymer.

The first flange 1318A and the second flange 1318B can extend from a base portion 1317 of the alignment frame 1316. The base portion 1317 can be located along the mounting structure 1302, such as along the second end 1310. In an example, the first flange 1318A and the second flange 1318B can be disposed at an angle of 30 to 90 degrees from the base portion 1317. In the example of FIGS. 13B-E, the first flange 1318A can extend at a 90 degree angle toward the mounting structure 1302 and the flange 1318B can extend at a 90 degree angle away from the mounting structure 1302. For instance, the first flange 1318A can interface with the mounting structure 1302 to align orient the alignment frame 1316 with the mounting structure 1302. The second flange 1318B can orient the mounting structure 1302 with the flow substrate 1300, when the mounting structure 1302 is secured to the flow substrate 1300.

The first flange 1318A or the second flange 1318B, or both, can be configured to align the mounting structure 1302 with respect to the flow substrate 1300. For example, the first flange 1318A or the second flange 1318B can be configured at an angle, such as 90 degrees, 60 degrees, 45 degrees, 30 degrees, or other angle between 10 degrees and 90 degrees with respect to a longitudinal axis of the mounting structure 1302 (e.g., an axis along the second end 1310 and extended through the central axes of the first aperture 1304A and the second aperture 1304B). The alignment frame 1316 can mitigate or eliminate the need for an alignment fixture to position or orient the mounting structure 1302 with respect to the flow substrate 1300. In some examples, the alignment frame 1316 can ensure proper alignment from the manufacturer and mitigate improper installation or customer modification.

Figure 13E:
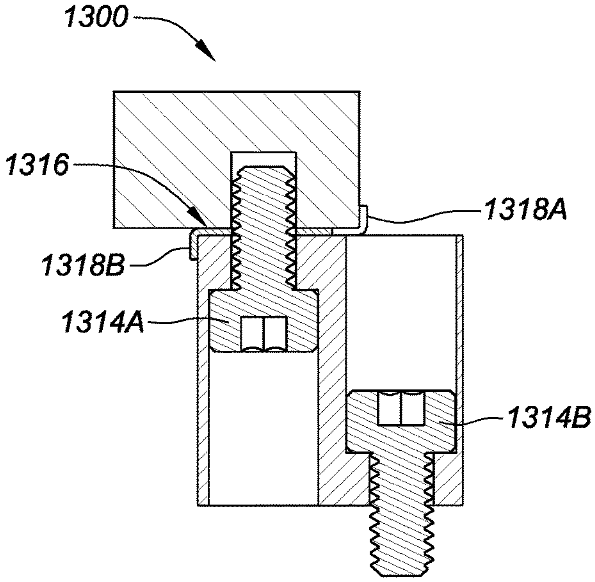

FIG. 13E illustrates an example of a cross section of the mounting structure 1302 including the first fastener 1314A inserted into the first aperture 1304A and the second fastener 1314B inserted into the second aperture 1304B. The alignment frame 1316 can be located to cover at least a portion of the second aperture 1304B or at least a portion of the second counterbore 1306B of the aperture 1304B, as depicted in FIGS. 13B, C, and E. Accordingly, the second fastener 1314B can be captured within the second aperture 1304B. Consequently, as previously described, the fastener 1314B can be retained within the fluid delivery stick 1303, such as during transport or installation. In another example, the fastener 1304B can be recessed or partially recessed within the mounting structure 1302, such as recessed with respect to the upper surface of the flow substrate 1300.

Figure 14A:
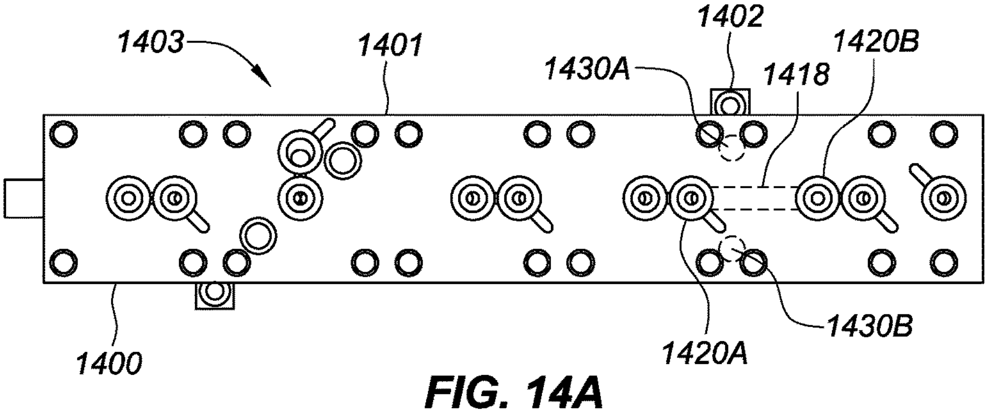
FIGS. 14A-D, depict another example of a mounting structure, consistent with embodiments of the present disclosure.
Figure 14B:
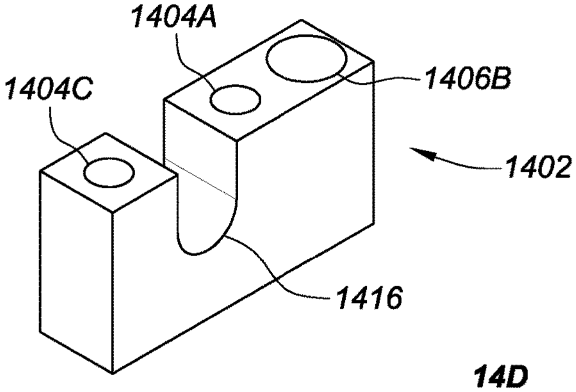
Figure 14C:
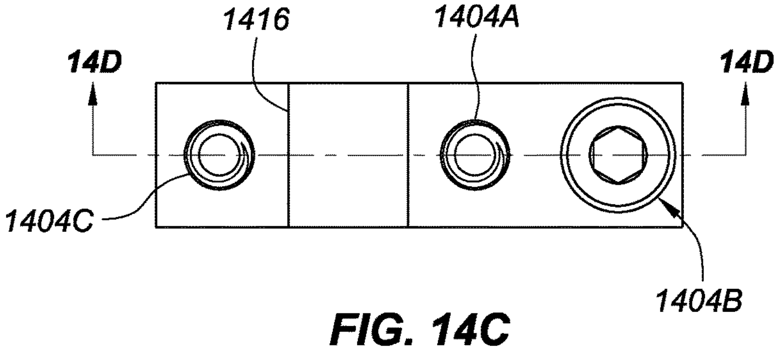
Figure 14D:
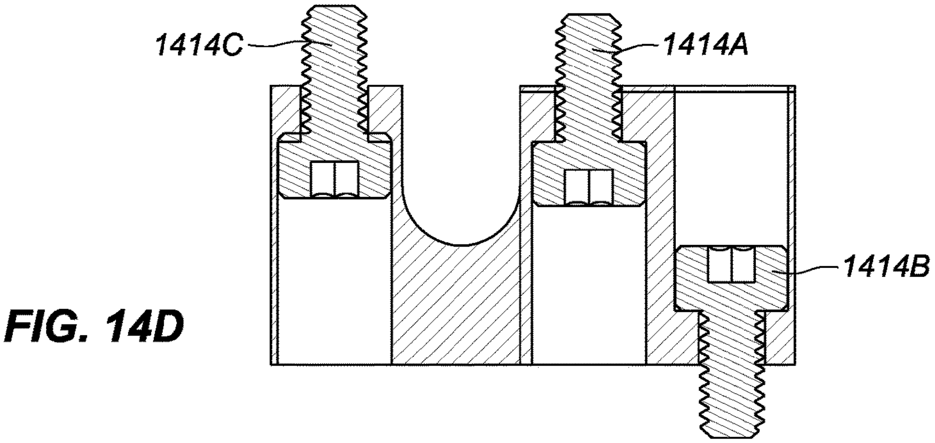

FIGS. 14A-D, depict another example of a mounting structure 1402. The mounting structure 1402 can include a first aperture 1404A, a second aperture 1404B, a first counterbore 1406A, and a second counterbore 1406B, as arranged and described in the examples of FIGS. 9A-D, 10A-E, 11A-D, 12A-E, and 13A-E. In the examples of FIGS. 14A-D, the mounting structure 1402 can include a third aperture 1404C. In an example, the third aperture 1404C can include a third counterbore 1406C. A fastener 1414A can be inserted inside of the first aperture 1404A as illustrated in the example of FIG. 14D, and another fastener 1414C can be inserted inside of the third aperture 1404C. One or more fasteners, such as the fastener 1414A and 1414C, can couple the mounting structure 1402 to the flow substrate 1400. For instance, the flow substrate 1400 can include one or more mounting apertures (as previously described), such as mounting apertures 1430A, B. The fasteners 1414A and 1414C can secure the mounting structure 1402 to the flow substrate 1400 using the respective mounting apertures 1430A, B.

As shown in the example of FIGS. 14A-D, the flow substrate 1400 can include a channel 1416. The channel 1416 can be located between the first aperture 1404A and the third aperture 1404C. The channel 1416 can provide an opening in the mounting structure 1402 for a fluid delivery line 1418. Thus, one or more fluid delivery lines 1418 can be routed along the lower side (e.g., along the cap 195 shown in FIGS. 8B, D-E, H-J and described herein) of the flow substrate 1400. In some examples, the mounting structure 1402 can be located between two ports 1420A and 1420B (e.g., conduit ports) of the flow substrate 1400. The channel 1416 can allow the fluid delivery line 1418 to be routed along the flow substrate 1400 in locations where one or more mounting structures 1402 are located. In an example the mounting structure 1402 can protect the fluid delivery line 1418 when the mounting structure 1402 is attached to the flow substrate 1400.

The first aperture 1414A and the third aperture 1414C can be positioned in the mounting structure 1402 to align the mounting structure 1402 with respect to the flow substrate 1400. In the examples of FIGS. 14A-D, the longitudinal axis of the mounting structure 1402 can be configured at a perpendicular angle to the longitudinal axis (e.g., along the primary direction of flow) of the flow substrate 1400. In other examples, the longitudinal axis or other axis of the mounting structure 1402 can be configured in other orientations with respect to the longitudinal axis of the flow substrate 1400, such as at a 30 degree, 45 degree, 60 degree, or other angle therebetween. The fasteners 1414A and 1414C can fix the location and orientation of the mounting structure 1402 with respect to the flow substrate 1400. In further examples, the mounting structure 1402, the flow substrate 1400, or both can include any of the alignment features described herein, such as the alignment features described in the examples of FIGS. 9A-D, 10A-E, 11A-D, 12A-E, and 13A-E, and further described herein.

When the mounting structure 1402 is coupled to the flow substrate 1400, the flow substrate 1400 can cover or partially cover the second aperture 1404B, such as the counterbore 1406B of the aperture 1404B, to capture the fastener 1414B within the aperture 1404B. Accordingly, as previously described, the fastener 1414B can be retained within the fluid delivery stick 1403, such as during transport or installation. In another example, the fastener 1414B can be recessed or partially recessed within the mounting structure 1402, such as recessed with respect to the upper surface of the flow substrate 1400.

In FIGS. 3-5 and 7, the mounting structures can couple a flow substrate to a manifold (e.g., another flow substrate). In some instances, a sufficient clamping or compression force can be provided by the mounting structure to effectively seal one or more fluid pathways of the flow substrate to one or more corresponding fluid pathways of the manifold. Accordingly, in some examples, the mounting structure can be constructed from a material having sufficient strength (a high strength material) to provide the clamp or compression force for sealing the fluid pathways between the flow substrate and the manifold. A metallic material stronger than aluminum (including aluminum alloys, stainless steel, and nickel alloys) is generally required. For example, the metallic material should have sufficient strength to withstand a clamping or compression force in semiconductor applications of at least 150 PSI or more. In other applications (e.g., medical applications, etc.) the metallic material (e.g., aluminum) should have sufficient strength to withstand a clamping or compression force of at least 50 PSI. In a further example, the dimensions of the mounting structure of the examples of FIGS. 3-5 and 7 can be constructed with sufficient precision to provide the clamping force to seal the fluid pathways between the flow substrate and the manifold.

The mounting structures of FIGS. 9-14 can be used to attach the flow substrate to a support surface or another flow substrate. In applications where lower clamping or compression forces are acceptable Accordingly, because a clamping or compression force is not necessary for providing a seal for the fluid connection between the flow substrates, the flow substrate can be manufactured with lower precision and a lower strength material. The mounting structures in the examples of FIGS. 9-14 can be constructed with a variety of materials, which can be selected based on properties, such as cost, manufacturability, strength of material, chemical compatibility, corrosion resistance, or the like. In some examples, the cost of such materials can be less when lower strength is required. For example, these mounting structures can be made from aluminum, aluminum alloys, polymer, or any material with sufficient strength to support the flow substrate(s) and related components when coupled with a mounting structure or another flow substrate.

Although several embodiments have been described above with a certain degree of particularity, those skilled in the art could make numerous alterations to the disclosed embodiments without departing from the spirit of the present disclosure. It is intended that all matter contained in the above description or shown in the accompanying drawings shall be interpreted as illustrative only and not limiting. Changes in detail or structure may be made without departing from the present teachings. The foregoing description and following claims are intended to cover all such modifications and variations.

Various embodiments are described herein of various apparatuses, systems, and methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments, the scope of which is defined solely by the appended claims.

Reference throughout the specification to "various embodiments," "some embodiments," "one embodiment," "an embodiment," or the like, means that a particular feature, structure, or characteristic described in connection with the embodiment is included in at least one embodiment. Thus, appearances of the phrases "in various embodiments," "in some embodiments," "in one embodiment," "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features structures, or characteristics of one or more other embodiments without limitation.

Any patent, publication, or other disclosure material, in whole or in part, that is said to be incorporated by reference herein is incorporated herein only to the extent that the incorporated materials does not conflict with existing definitions, statements, or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

What is claimed is:

1. A flow substrate mounting structure comprising:

a first fastener aperture defined in a first surface of the flow substrate mounting structure, wherein the first fastener aperture extends through the flow substrate mounting structure from the first surface to a second surface, wherein a diameter of the first fastener aperture defined in the first surface is larger than a diameter of the first fastener aperture defined in the second surface;

a second fastener aperture defined in the second surface of the flow substrate mounting structure, wherein the first surface is disposed on an opposite side of the flow mounting structure from the second surface and wherein the second fastener aperture extends through the flow substrate mounting structure from the second surface to the first surface, wherein a diameter of the second fastener aperture defined in the second surface is larger than a diameter of the second fastener aperture defined in the first surface; and a slot defined in the second surface along at least a portion of the diameter of the first fastener aperture defined in the second surface.

2. The flow substrate mounting structure of claim 1, wherein the flow substrate mounting structure comprises one or more of an aluminum alloy and a polymer.

3. The flow substrate mounting structure of claim 1, wherein the flow substrate mounting structure is configured to couple with a flow substrate of any thickness.

4. A flow substrate comprising:

a substrate body comprising a component attachment surface, wherein the component attachment surface comprises a plurality of conduit ports; and a flow substrate mounting structure including:

a first fastener aperture and a second fastener aperture, wherein the first fastener aperture and the second fastener aperture are each configured to receive a fastener for coupling the flow substrate mounting structure with the substrate body, and wherein the first fastener aperture is defined in a first surface of the flow substrate mounting structure and the second fastener aperture is defined in a second surface of the flow substrate mounting structure, wherein the first surface is disposed on an opposite side of the flow mounting structure from the second surface; and a first counterbore and a second counterbore, wherein the first counterbore is axially aligned with the first fastener aperture and defined in the second surface of the flow substrate mounting structure and the second counterbore is axially aligned with the second fastener aperture and defined in the first surface of the flow substrate mounting structure.

5. The flow substrate of claim 4, further comprising a cap, wherein the cap is configured to couple with the substrate body.

6. The flow substrate of claim 4, wherein the substrate body further comprises a substrate body aperture, wherein the substrate body aperture is configured to receive an alignment pin or a dowel pin.

7. The flow substrate of claim 4, wherein a cap further comprises a cap aperture and the flow substrate mounting structure comprises a mounting structure aperture.

8. The flow substrate of claim 7, further comprising an alignment pin or a dowel pin removably coupled with one or more of a flow substrate aperture, a flow substrate mounting structure aperture, and the cap aperture.

9. The flow substrate of claim 7, further comprising an alignment pin removably coupled with the cap aperture.

10. The flow substrate of claim 4, further comprising an alignment frame coupled with the flow substrate mounting structure, wherein the alignment frame is configured to align the flow substrate mounting structure with the flow substrate and wherein the alignment frame is a separate element from the flow substrate and the flow substrate mounting structure.

11. The flow substrate of claim 4, the flow substrate mounting structure further comprising a first alignment step integrated with the flow substrate mounting structure and the flow substrate further comprising a flow substrate edge, wherein the first alignment step is configured to couple with a portion of the flow substrate edge.

12. The flow substrate of claim 4, the flow substrate mounting structure further comprising an alignment slot and the flow substrate further comprising an alignment element, wherein the alignment element is configured to removably couple with the alignment slot.

13. The flow substrate of claim 12, wherein the alignment element comprises a plate.

14. The flow substrate of claim 4, the flow substrate mounting structure further comprising a channel, wherein the channel comprises a fluid delivery line.

15. The flow substrate of claim 14, wherein the fluid delivery line fluidly connects at least two of the plurality of fluid conduit ports.

16. A flow substrate mounting structure comprising:

a clamp portion configured to couple with a portion of a first surface of a first flow substrate and with a second surface of a second flow substrate;

a first fastener aperture, wherein the first fastener aperture is defined in a first surface of the flow mounting structure and extends through the clamp portion and a standoff portion and is configured to receive a fastener;

a second fastener aperture defined in a second surface of the flow substrate mounting structure, wherein the first surface is disposed on an opposite side of the flow mounting structure from the second surface, and wherein the first fastener aperture is oriented in an opposing direction with respect to the second fastener aperture;

a first bearing surface defined at a first internal end of the first fastener aperture;

a second bearing surface defined at a second internal end of the second fastener aperture; and a first locking pin aperture configured to couple with a first locking pin.

17. The flow substrate mounting structure of claim 16, wherein the standoff portion is located proximate the clamp portion, wherein the standoff portion comprises a second fastener aperture that corresponds to the first fastener aperture and the standoff portion is configured to couple the first flow substrate with a mounting surface and a second locking pin aperture configured to couple with a second locking pin, wherein the flow substrate mounting structure is configured to couple with the first flow substrate of a fixed thickness.

* * * * *